US012408391B2

(12) United States Patent
Song et al.

(10) Patent No.: US 12,408,391 B2
(45) Date of Patent: Sep. 2, 2025

(54) DISPLAY DEVICE INCLUDING A SENSING LAYER FOR SENSING AN EXTERNAL INPUT DEVICE AND METHOD OF DRVING THE SAME

(71) Applicant: Samsung Electronics Co., Ltd., Suwon-si (KR)

(72) Inventors: Inhyun Song, Suwon-si (KR); Ohseong Kwon, Hwaseong-si (KR); Junggil Yang, Hwaseong-si (KR); Jooho Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 448 days.

(21) Appl. No.: 17/814,876

(22) Filed: Jul. 26, 2022

(65) Prior Publication Data

US 2023/0139314 A1 May 4, 2023

(30) Foreign Application Priority Data

Nov. 2, 2021 (KR) .................. 10-2021-0149072

(51) Int. Cl.
*H10D 62/10* (2025.01)
*H10D 30/43* (2025.01)
(Continued)

(52) U.S. Cl.
CPC ........... *H10D 62/115* (2025.01); *H10D 30/43* (2025.01); *H10D 30/6735* (2025.01);
(Continued)

(58) Field of Classification Search
CPC .... H10D 30/43; H10D 30/435; H10D 30/501; H10D 30/502; H10D 30/503; H10D 30/504; H10D 30/506; H10D 30/507; H10D 30/508; H10D 30/509; H10D 30/6735; H10D 30/797; H10D 30/6219;
(Continued)

(56) References Cited

U.S. PATENT DOCUMENTS 9,899,416 B2   2/2018  Kim et al.
10,490,559 B1  11/2019 Ando et al.
(Continued)

FOREIGN PATENT DOCUMENTS

KR   20220115245 A   8/2022

*Primary Examiner* — Michael M Trinh
(74) *Attorney, Agent, or Firm* — Myers Bigel, P.A.

(57) ABSTRACT

A semiconductor device includes: a substrate including an active region extending in a first direction; a gate electrode extending in a second direction and intersecting the active region, the gate electrode including first electrode layer(s) and a second electrode layer; channel layers spaced apart from each other in a third direction and at least partially surrounded by the gate electrode; source/drain regions, with at least one source/drain region on each side of the gate electrode and electrically connected to the channel layers; and air gap regions in the second electrode layer between the channel layers and between a lowermost channel layer and the active region in the third direction. The first electrode layer(s) or the second electrode layer has a first thickness between adjacent ones of the channel layers in the third direction, and has a second thickness greater than the first thickness on side surfaces of the channel layers.

15 Claims, 20 Drawing Sheets

(51) Int. Cl.
*H10D 30/67* (2025.01)
*H10D 84/03* (2025.01)
*H10D 84/83* (2025.01)
*H10D 30/01* (2025.01)
*H10D 64/01* (2025.01)
*H10D 84/01* (2025.01)

(52) U.S. Cl.
CPC ......... *H10D 30/6757* (2025.01); *H10D 84/83* (2025.01); *H10D 30/014* (2025.01); *H10D 64/01* (2025.01); *H10D 64/017* (2025.01); *H10D 84/0128* (2025.01); *H10D 84/0151* (2025.01); *H10D 84/038* (2025.01)

(58) Field of Classification Search
CPC .. H10D 30/6211; H10D 30/01; H10D 30/014; H10D 30/0191; H10D 30/0193; H10D 30/0194; H10D 30/0195; H10D 30/0196; H10D 30/0197; H10D 30/0198; H10D 30/0273; H10D 62/115; H10D 62/364; H10D 62/121; H10D 62/151; H10D 62/822; H10D 62/83; H10D 64/01; H10D 64/017; H10D 64/256; H10D 64/254; H10D 64/257; H10D 64/666; H10D 84/83; H10D 84/8311; H10D 84/8312; H10D 84/83135; H10D 84/83138; H10D 84/8314; H10D 84/8316; H10D 84/832; H10D 84/833; H10D 84/834; H10D 84/835; H10D 84/836; H10D 84/937; H10D 84/839; H10D 84/0153; H10D 84/128; H10D 84/038; H10D 84/01; H10D 84/014; H10D 84/0142; H10D 84/0158; H10D 84/0151; H10D 84/02; H10D 84/032; H10D 84/035; H10D 84/05; H10D 84/07; H10D 84/08; B82Y 10/00

See application file for complete search history.

(56) References Cited

U.S. PATENT DOCUMENTS

| | | |
|---|---|---|
| 10,896,816 B2 | 1/2021 | Bi et al. |
| 10,930,649 B2 | 2/2021 | Kang et al. |
| 2019/0157414 A1* | 5/2019 | Ando .................... H10D 62/121 |
| 2019/0305104 A1* | 10/2019 | Xie ...................... H10D 62/121 |
| 2020/0006356 A1* | 1/2020 | Ando ...................... B82Y 10/00 |
| 2020/0083352 A1* | 3/2020 | Chanemougame .......................... H10D 30/6757 |
| 2021/0134794 A1 | 5/2021 | Huang et al. |
| 2021/0202709 A1 | 7/2021 | Lee et al. |
| 2022/0069078 A1* | 3/2022 | Yu ........................ H10D 64/251 |
| 2022/0115514 A1* | 4/2022 | Jung ..................... H10D 62/121 |
| 2022/0254781 A1 | 8/2022 | Song et al. |

* cited by examiner

DISPLAY DEVICE INCLUDING A SENSING LAYER FOR SENSING AN EXTERNAL INPUT DEVICE AND METHOD OF DRVING THE SAME

CROSS-REFERENCE TO RELATED APPLICATION(S)

This application claims the benefit below 35 USC 119(a) of Korean Patent Application No. 10-2021-0149072 filed on Nov. 2, 2021, in the Korean Intellectual Property Office, the entire disclosure of which is incorporated herein by reference for all purposes.

BACKGROUND

The present disclosure relates to a semiconductor device.

As demand for high performance, high speed, and/or multifunctionality of semiconductor devices increase, the degree of integration of semiconductor devices is increasing. In manufacturing a semiconductor device having a fine pattern corresponding to the trend for high integration of semiconductor devices, it may be beneficial to implement patterns having a fine width or a fine separation distance. In addition, in order to reduce limitations in operating characteristics due to size reductions of planar metal oxide semiconductor FETs (MOSFETs), efforts are being made to develop a semiconductor device having a channel including a three-dimensional structure.

SUMMARY

Example embodiments provide a semiconductor device having improved electrical characteristics and reliability.

According to example embodiments, a semiconductor device comprises: a substrate including an active region extending in a first direction; a gate electrode extending in a second direction and intersecting the active region on the substrate, the gate electrode comprising at least one first electrode layer and a second electrode layer; a plurality of channel layers on the active region and spaced apart from each other in a third direction perpendicular to an upper surface of the substrate the plurality of channel layers at least partially surrounded by the gate electrode; a plurality of source/drain regions, with at least one source/drain region on each side of the gate electrode, the plurality of channel layers electrically connected to the plurality of channel layers; and one or more air gap regions located in the second electrode layer between the plurality of channel layers and between a lowermost channel layer of the plurality of channel layers and the active region in the third direction. The at least one first electrode layer or the second electrode layer has a first thickness between adjacent ones of the plurality of channel layers in the third direction, and has a second thickness on side surfaces of the plurality of channel layers, wherein the second thickness is greater than the first thickness.

According to example embodiments, a semiconductor device comprises: a substrate having first and second regions, the substrate comprising an active region on each of the first and second regions, respectively; a first gate electrode on the first region intersecting the active region and comprising at least one first electrode layer and a second electrode layer; a second gate electrode on the second region intersecting the active region and comprising at least one third electrode layer and a fourth electrode layer; a plurality of channel layers on each of the active regions, respectively, the plurality of channel layers spaced apart from each other in a vertical direction perpendicular to an upper surface of the substrate and at least partially surrounded by the first and second gate electrodes, respectively; and one or more air gap regions located in the fourth electrode layer between at least portions of the plurality of channel layers on the second region in the vertical direction. The at least one third electrode layer comprises a same material as a material of the at least one first electrode layer, and the fourth electrode layer comprises a same material as a material of the second electrode layer, and wherein the at least one first electrode layer has a first thickness on the first region, and the at least one third electrode layer on the second region has a second thickness that is less than the first thickness.

According to example embodiments, a semiconductor device comprises: a substrate comprising an active region; a gate electrode extending on the substrate and intersecting the active region, the gate electrode comprising a first electrode layer; a plurality of channel layers on the active region and spaced apart from each other in a vertical direction perpendicular to an upper surface of the substrate the plurality of channel layers at least partially surrounded by the gate electrode a plurality of source/drain regions, with at least one source/drain region on each side of the gate electrode, the plurality of source/drain regions electrically connected to the plurality of channel layers; and one or more air gap regions located in the gate electrode between the plurality of channel layers in the vertical direction. The first electrode layer surrounds an entirety of each of the one or more air gap regions and has a reduced thickness in a region overlapping the one or more air gap regions in the vertical direction.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
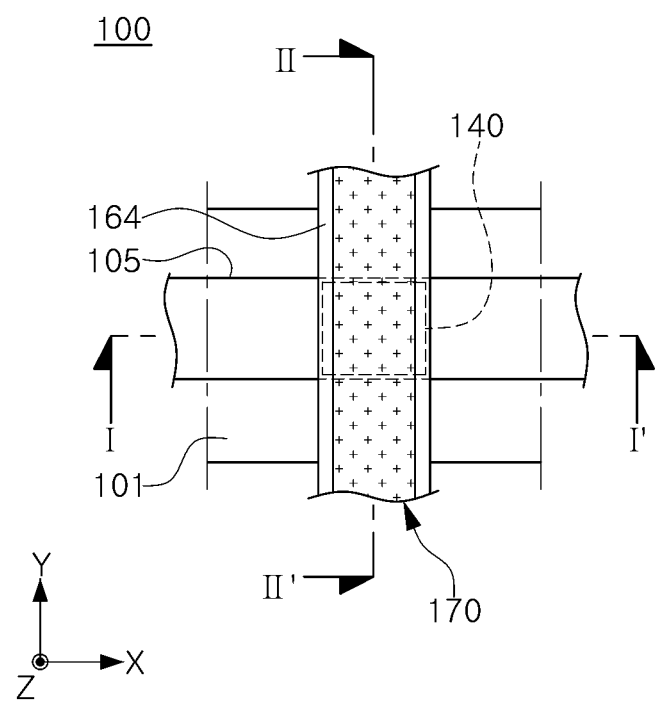
FIG. 1 is a layout diagram illustrating a semiconductor device according to example embodiments.

FIG. 1 is a layout diagram illustrating a semiconductor device according to example embodiments. For convenience of description, only some components of the semiconductor device are illustrated in FIG. 1.

Figure 2:
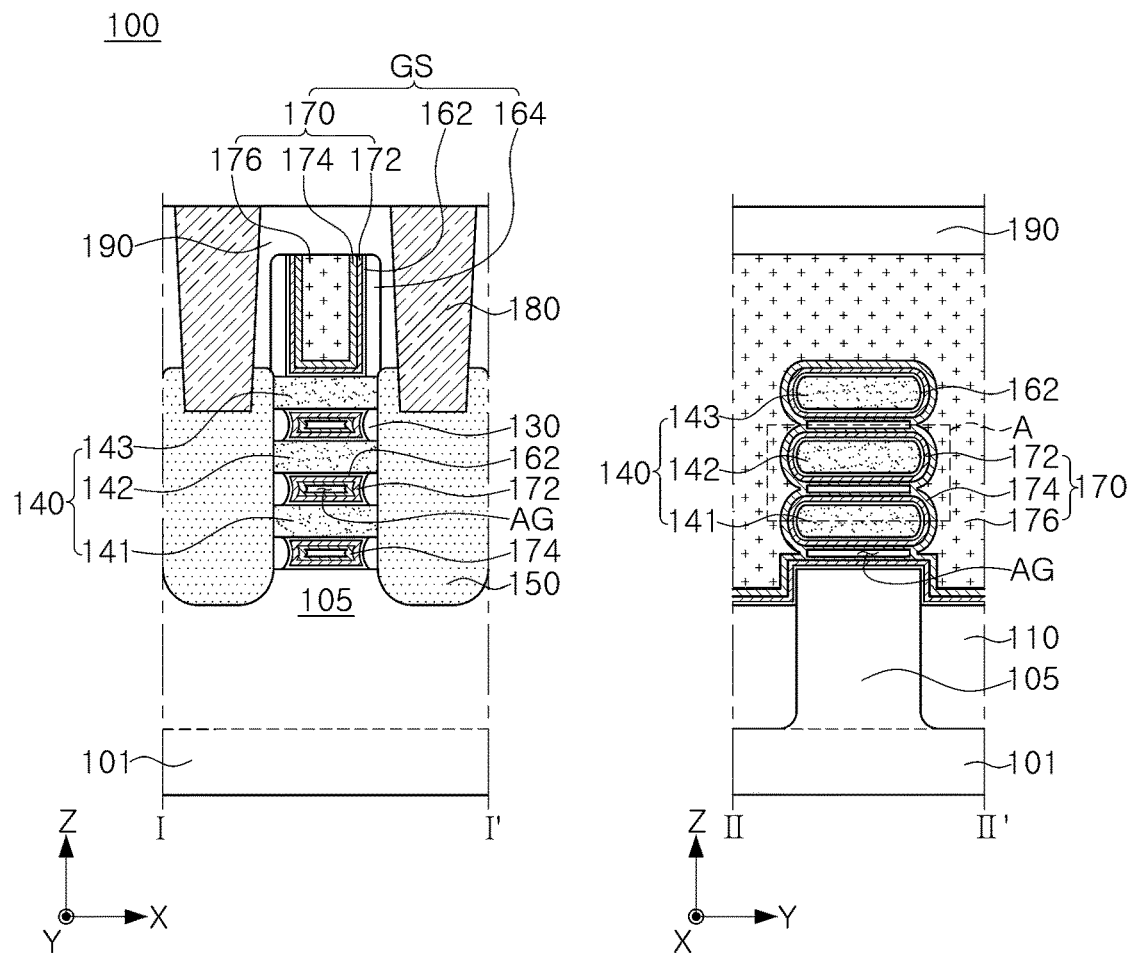
FIG. 2 includes schematic cross-sectional views illustrating a semiconductor device according to example embodiments.

FIG. 2 includes schematic cross-sectional views illustrating a semiconductor device according to example embodiments. FIG. 2 illustrates cross-sections taken along lines I-I' and II-II' of FIG. 1.

Figure 3:
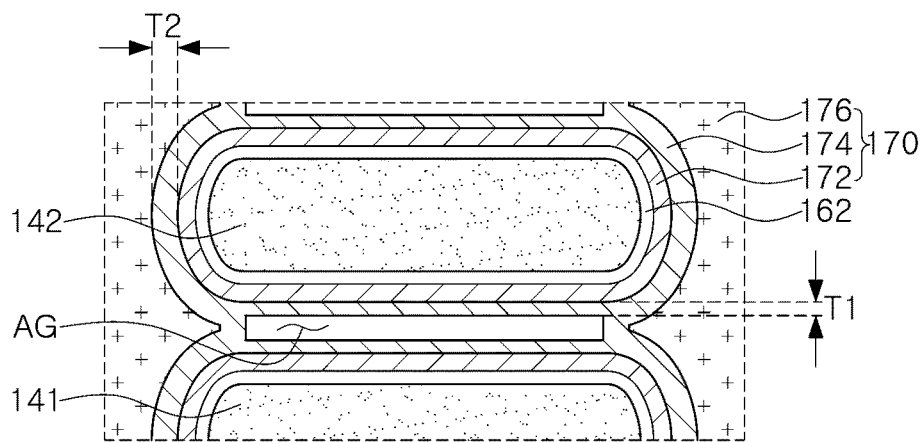
FIG. 3 is a partially enlarged view illustrating a portion of the semiconductor device of FIG. 2 according to example embodiments.

FIG. 3 is a partially enlarged view illustrating a portion of the semiconductor device of FIG. 2 according to example embodiments. FIG. 3 illustrates an enlarged area 'A' of FIG. 2.

Referring to FIGS. 1 to 3, a semiconductor device 100 may include a substrate 101 including an active region 105, a channel structure 140 including first to third channel layers 141, 142 and 143 vertically spaced apart from each other on the active region 105, a gate structure GS extending through and intersecting the active region 105 and including a gate electrode 170, source/drain regions 150 in contact with the channel structure 140, air gap regions AG located in the gate electrode 170, and contact plugs 180 connected to the source/drain regions 150. The semiconductor device 100 may further include an isolation layer 110, inner spacer layers 130, and an interlayer insulating layer 190. The gate structure GS includes gate dielectric layers 162, gate spacer layers 164, and the gate electrode 170 including the first to third electrode layers 172, 174, and 176.

In the semiconductor device 100, the active region 105 may have a fin shape, and the gate electrode 170 may be between the active region 105 and the channel structure 140, between the first to third channel layers 141, 142, and 143 of the channel structure 140, and on the channel structure 140. Accordingly, the semiconductor device 100 may include a transistor having a multi-bridge channel FET (MBCFET™) structure, which is a gate-all-around field effect transistor.

The substrate 101 may have an upper surface extending in the X-direction and the Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like.

The substrate 101 may include an active region 105 in an upper portion thereof. The active region 105 may be defined by a device isolation layer 110 in the substrate 101 and may extend in a first direction, for example, the X-direction. However, it may be possible to describe the active region 105 as an element separate from the substrate 101 according to one embodiment. The active region 105 may have a structure extending upwardly. The active region 105 may be formed as a portion of the substrate 101, or may include an epitaxial layer grown from the substrate 101. However, on both sides of the gate structure GS, the active region 105 may be partially recessed to form recess regions, and source/drain regions 150 may be disposed in the recess regions.

In example embodiments, the active region 105 may or may not include a well region including impurities. For example, in the case of a P-type transistor (pFET), the well region may include N-type impurities such as phosphorus (P), arsenic (As), or antimony (Sb), and in the case of an N-type transistor, the well region may include P-type impurities such as boron (B), gallium (Ga), or aluminum (Al). In the case of including the well region, the well region may be located at a predetermined depth from the upper surface of the active region 105.

The device isolation layer 110 may define the active region 105 in the substrate 101. The device isolation layer 110 may be formed by, for example, a shallow trench isolation (STI) process. In some embodiments, the device isolation layer 110 may further include a region extending relatively further deeply while having a step into a lower portion of the substrate 101. The device isolation layer 110 may expose an upper surface of the active region 105, or partially expose an upper portion of the active region 105. In example embodiments, the device isolation layer 110 may have a curved upper surface to have a higher level as it approaches the active region 105. In some embodiments, "level" may mean a height level when viewed with respect to a reference plane, such as an upper surface of the substrate 101. When an Element A is said to be at a "higher level" than Element B, this may mean that Element A is a height level that is further away from an upper surface of the substrate 101 than the height level of Element B. When an Element A is said to be at a "lower level" than Element B, this may mean that Element A is a height level that is closer to an upper surface of the substrate 101 than the height level of Element B. The device isolation layer 110 may be formed of an insulating material. The device isolation layer 110 may be formed of, for example, an oxide, a nitride, or a combination thereof.

The channel structure 140 may be on the active region 105 in regions in which the active region 105 intersects the gate structure GS. The channel structure 140 may include first to third channel layers 141, 142, and 143, which are two or more channel layers spaced apart from each other in the Z-direction. The channel structure 140 may be connected to the source/drain regions 150, such as by being electrically connected. The channel structure 140 may have a width equal to or smaller than that of the active region 105 in the Y-direction, and may have a width equal to or similar to that of the gate structure GS in the X-direction. In some embodiments, the channel structure 140 may have a reduced width such that side surfaces are below the gate structure GS in the X-direction. As used herein, when the term Element A is "below" Element B is used, it may refer to the situation where Element A is closer to a reference plane, such as substrate 101, in a particular direction than Element B. Likewise, when the term Element A is "above" Element B is used, it may refer to the situation where Element A is further away from a reference plane, such as substrate 101, in a particular direction than Element B.

The channel structure 140 may be formed of a semiconductor material, and may include, for example, at least one of silicon (Si), silicon germanium (SiGe), and germanium (Ge). The channel structure 140 may be formed of, for example, the same material as a material of the substrate 101. In some embodiments, the channel structure 140 may include an impurity region in a region adjacent to the source/drain regions 150. The number and shape of the channel layers constituting one channel structure 140 may be variously changed in the example embodiments. For example, in some embodiments, the channel structure 140 may further include a channel layer below a lowermost portion of the gate electrode 170.

The source/drain regions 150 may be on both sides of the gate structure GS in recess regions partially recessed from the upper portions of the active regions 105, such that at least one source/drain region 150 is on each side of the gate structure GS. The source/drain regions 150 may be on, and at least partially cover, side surfaces of each of the first to third channel layers 141, 142, and 143 of the channel structure 140. The upper surfaces of the source/drain regions 150 may be at the same or similar height as the lower surface of an uppermost portion of the gate electrode 170, and the height may be variously changed in example embodiments. According to example embodiments, the source/drain regions 150 may be connected to or merged with each other on two or more active regions 105 adjacent to each other in the Y-direction to form one source/drain region 150. The source/drain regions 150 may include impurities.

The gate structure GS may intersect the active region 105 and the channel structure 140 to extend in the second direction, for example, the Y-direction. Channel regions of transistors may be formed in the channel structure 140 intersecting the gate electrode 170 of the gate structure GS. The gate structure GS may include the gate electrode 170, the gate dielectric layers 162 between the gate electrode 170 and the channel structure 140, and the gate spacer layers 164 on sides of the gate electrode 170. In some embodiments, the gate structure GS may further include a capping layer on the upper surface of the gate electrode 170. Alternatively, a portion of the interlayer insulating layer 190 on the gate structure GS may be referred to as a gate capping layer.

The gate dielectric layers 162 may be between the active region 105 and the gate electrode 170 and between the channel structure 140 and the gate electrode 170, and may be on, and cover at least a portion of, the surfaces of the gate electrode 170. For example, the gate dielectric layers 162 may surround all surfaces except an uppermost surface of the gate electrode 170. The gate dielectric layers 162 may extend between the gate electrode 170 and the gate spacer layers 164, but the configuration is not limited thereto. The gate dielectric layers 162 may include oxide, nitride, or a high-k material. The high-k material may refer to a dielectric material having a higher dielectric constant than that of a silicon oxide layer ($SiO_2$). The high-k material may be any one of, for example, aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In some embodiments, the gate dielectric layers 162 may be formed of a multilayer film.

The gate spacer layers 164 may be on both sides of the gate electrode 170. The gate spacer layers 164 may insulate the source/drain regions 150 from the gate electrode 170. In some embodiments, the gate spacer layers 164 may have a multi-layer structure. The gate spacer layers 164 may be formed of oxide, nitride, and oxynitride, and in detail, a low-k film, wherein a low-k film may refer to a dielectric material having the same dielectric constant as that of a silicon oxide layer ($SiO_2$) or having a lower dielectric constant than that of a silicon oxide layer ($SiO_2$).

The gate electrode 170 may be on the active region 105 to at least partially fill a gap between the channel structures 140 and extend upwardly from the channel structures 140. The gate electrode 170 may be spaced apart from the channel structure 140 by the gate dielectric layers 162. The gate electrode 170 may include first to third electrode layers 172, 174, and 176 sequentially stacked from the gate dielectric layers 162. The first electrode layer 172 may comprises a plurality of layers in some embodiments and may be a single layer in other embodiments. The term "first electrode layer 172" as used herein may refer to a single layer or a plurality of layers but will include at least one layer.

As illustrated in FIGS. 2B and 3, in a cross-section of the gate electrode 170, the first electrode layer 172 may surround the first to third channel layers 141, 142, and 143 respectively, and may be spaced apart from each other in the Z-direction. It will be understood that "an element A surrounds an element B" (or similar language) as used herein means that the element A is at least partially around the element B but does not necessarily mean that the element A completely encloses the element B, unless it is so indicated. The first electrode layer 172 may further be on upper surfaces of the active region 105 and the device isolation layer 110. A gate dielectric layer 162 may be between the first electrode layer 172 and the first to third channel layers 141, 142, and 143 and between the first electrode layer 172 and the active region 105. In this embodiment, the first electrode layer 172 may have a uniform or constant thickness. The first electrode layer 172 may be spaced apart from the air gap regions AG and may not contact the air gap regions AG.

The second electrode layer 174 may be on the first electrode layer 172. The second electrode layer 174 may be between the first to third channel layers 141, 142, and 143 together with the first electrode layer 172. As illustrated in FIGS. 2B and 3, the second electrode layer 174 may surround the respective first to third channel layers 141, 142, and 143 in a cross-section of the gate electrode 170, and may be in a connected form in the Z-direction as a single layer. The second electrode layer 174 may extend downwardly along side surfaces of the first to third channel layers 141, 142 and 143, and may have a curve corresponding to side surfaces of the first to third channel layers 141, 142 and 143. Air gap regions AG are in the second electrode layer 174, and the second electrode layer 174 may completely or entirely surround the respective air gap regions AG in some embodiments.

The second electrode layer 174 may have a non-uniform or non-constant thickness and may be non-conformally disposed around the first to third channel layers 141, 142, and 143. The second electrode layer 174 may be on the upper surface of the active region 105, on portions of the upper surfaces of the first to third channel layers 141, 142, and 143, and on lower surfaces of the first to third channel layers 141, 142 and 143, and may have a relatively thin thickness or reduced thickness. The second electrode layer 174 may have a relatively thin thickness between the first to third channel layers 141, 142, and 143 and between the first channel layer 141 and the active region 105. The second electrode layer 174 may have a relatively thin thickness above and below the air gap regions AG. As illustrated in FIG. 3, the second electrode layer 174 may have a first thickness T1 in a region extending horizontally toward the air gap regions AG, and may have a second thickness T2 greater than the first thickness T1 on the side surfaces of the first to third channel layers 141, 142 and 143 and the upper surface of the device isolation layer 110. The second electrode layer 174 may have the first thickness T1 in a region overlapping the air gap regions AG in the Z-direction. As used herein, when element A is said to "overlap" or is "overlapping" element B, it may refer to the situation where element A is said to extend over or past, and cover a part of, element B in a given direction. Note that element A may overlap element B in a first direction, but may or may not overlap element B in a second direction. The second electrode layer 174 may be formed by a method different from that of the first electrode layer 172, to have the profile as described above. This will be described in more detail below with reference to FIGS. 9 and 10G.

The third electrode layer 176 may be on the second electrode layer 174 and may extend in the Y-direction while filling between the adjacent active regions 105. Unlike the first and second electrode layers 172 and 174, the third electrode layer 176 may not be between the first to third channel layers 141, 142, and 143 in the Z-direction. The third electrode layer 176 may have a thickness greater than that of the first and second electrode layers 172 and 174. In some embodiments, the third electrode layer 176 may be omitted.

The gate electrode 170 may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. The first to third electrode layers 172, 174, and 176 may include different materials. The first electrode layer 172 and the second electrode layer 174 may include materials having different work functions. For example, the second electrode layer 174 may include a material having a lower work function than a work function of the first electrode layer 172. For example, the first electrode layer 172 may include Titanium Nitride (TiN), the second electrode layer 174 may include aluminum (Al), for example, Titanium Aluminum Carbide (TiAlC) or Titanium Aluminum Nitride (TiAlN), and the third electrode layer 176 may include tungsten (W) or molybdenum (Mo).

The air gap regions AG may be between the first to third channel layers 141, 142, and 143 and between the first channel layer 141, which is the lowermost channel layer of the first to third channel layers 141, 142, 143, and the active region 105. The air gap regions AG may be located in the second electrode layer 174, and thus may be defined by the second electrode layer 174. The air gap regions AG are regions formed of air or gas, but in the present specification, for ease of understanding, may be regarded as one region or layer. A plurality of air gap regions AG may be spaced apart from each other in the Z-direction. The number of air gap regions AG may be changed according to the number of channel layers constituting the channel structure 140.

Lengths of the air gap regions AG in a horizontal direction, for example, an X-direction and a Y-direction, may be relatively longer than lengths in a vertical direction, for example, a Z-direction. The length of the air gap regions AG in the vertical direction may be determined by the distance between the first to third channel layers 141, 142, and 143 (a separation distance) and the thickness of the first and second electrode layers 172 and 174. By adjusting at least one of a uniform thickness of the first electrode layer 172 and a non-uniform thickness of the second electrode layer 174, the size of the air gap regions AG may be adjusted, and accordingly, the threshold voltage of the semiconductor device 100 may be adjusted. For example, the length of the air gap regions AG in the vertical direction may be in the range of about 20% to about 50% of the distance between the adjacent channel layers 141, 142, and 143. For example, the length may range from about one nanometer (1 nm) to about five (5) nm, but is not limited thereto.

The inner spacer layers 130 may be between the channel structures 140 in parallel with the gate electrode 170. The gate electrode 170 may be stably spaced apart from the source/drain regions 150 by the inner spacer layers 130 to be electrically isolated from each other. The inner spacer layers 130 may have a shape in which the side surface facing the gate electrode 170 is inwardly, convexly rounded toward the gate electrode 170, but the configuration is not limited thereto. The inner spacer layers 130 may be formed of oxide, nitride, or oxynitride, and in detail, may be formed of a low-k film. However, in some embodiments, the inner spacer layers 130 may be omitted.

The contact plugs 180 may pass through the interlayer insulating layer 190 to be connected to the source/drain regions 150, and may apply an electrical signal to the source/drain regions 150. The contact plugs 180 may have inclined side surfaces in which a lower width is narrower than an upper width according to an aspect ratio, but the configuration is not limited thereto. For example, the contact plugs 180 may extend downwardly from an upper portion, for example, to further below the lower surface of the third channel layer 143, but the configuration is not limited thereto. In some example embodiments, the contact plugs 180 may contact upper surfaces of the source/drain regions 150 without recessing the source/drain regions 150.

The contact plugs 180 may include a metal silicide layer on a lower end including a lower surface, and may further include a barrier layer on an upper surface and sidewalls of the metal silicide layer. The barrier layer may include, for example, a metal nitride such as titanium nitride (TiN), tantalum nitride (TaN), or tungsten nitride (WN). The contact plugs 180 may include, for example, a metal material such as aluminum (Al), tungsten (W), or molybdenum (Mo). In example embodiments, the number and arrangement of the conductive layers constituting the contact plugs 180 may be variously changed.

The interlayer insulating layer 190 may be on, and at least partially cover, the source/drain regions 150 and the gate structure GS, and be on, and at least partially cover, the device isolation layer 110. The interlayer insulating layer 190 may include at least one of an oxide, a nitride, and an oxynitride, and may include, for example, a low-k material. In some embodiments, the interlayer insulating layer 190 may include a plurality of insulating layers.

Figure 4A:
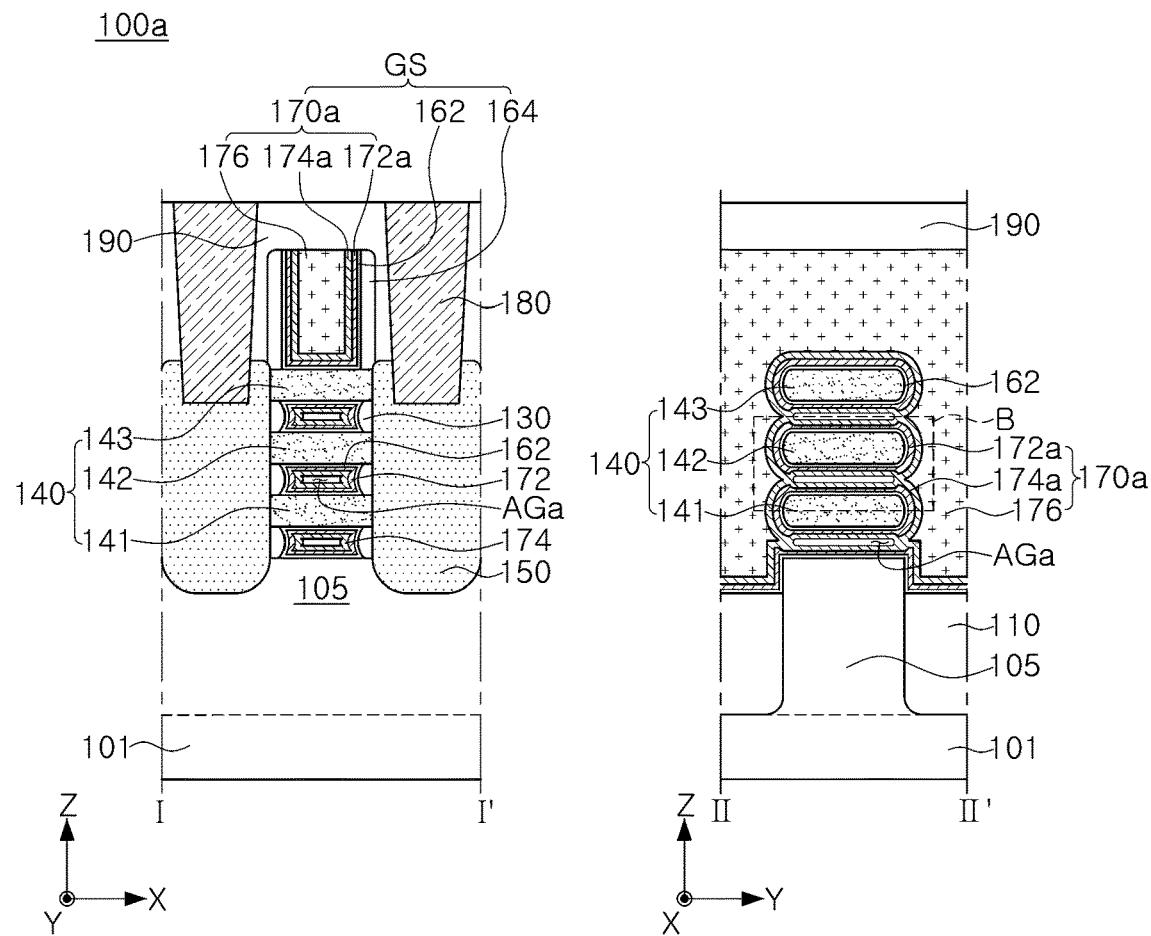
FIGS. 4A and 4B are schematic cross-sectional views and partially enlarged views illustrating a semiconductor device according to example embodiments.
Figure 4B:
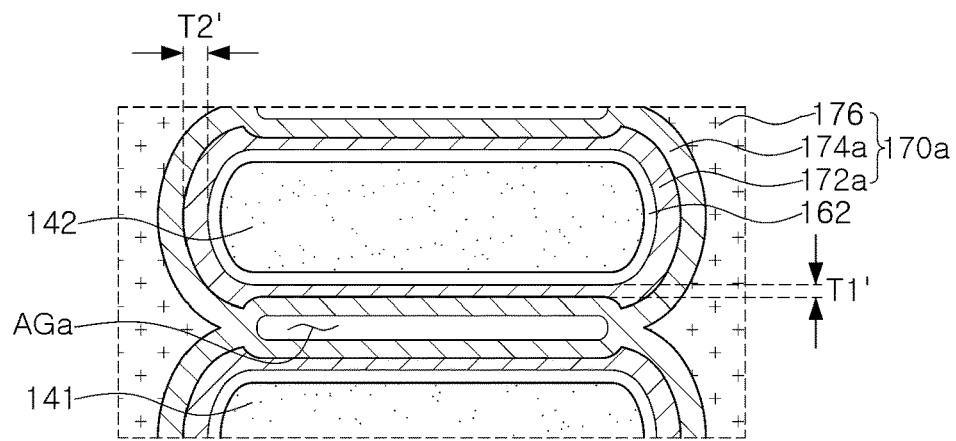

FIGS. 4A and 4B are schematic cross-sectional views and partially enlarged views illustrating a semiconductor device according to an example embodiment. FIG. 4B illustrates an enlarged area 'B' of FIG. 4A. FIGS. 4A and 4B may include elements similar to those previously discussed. Thus, the same or similar reference numerals may be used to refer to the same or similar elements, and a description of those elements will not be repeated here.

Referring to FIGS. 4A and 4B, in a semiconductor device 100a, the shapes of first and second electrode layers 172a and 174a of a gate electrode layer 170a may be different from those of the example embodiments of FIGS. 2 and 3.

The first electrode layer 172a may have a non-uniform or non-constant thickness around the first to third channel layers 141, 142, and 143 and may be non-conformally disposed thereon. The first electrode layer 172a have a relatively thin first thickness T1' between the first to third channel layers 141, 142 and 143 and on the upper surface of the active region 105, and may have a second thickness T2' greater than the first thickness T1' on side surfaces of the first to third channel layers 141, 142, and 143. The first electrode layer 172a may have a relatively thin thickness in a region overlapping the air gap regions AGa in the Z-direction. In contrast, the second electrode layer 174*a* may have a uniform or constant thickness on the first electrode layer 172*a*.

In some embodiments, according to the profiles of the first electrode layer 172*a* and the second electrode layer 174*a*, air gap regions AGa may have a relatively thinned shape on the ends as compared to on the central portions in a cross-section in the Y-direction. However, the detailed shape of the air gap regions AGa is not limited thereto.

In some embodiments, a fourth electrode layer (not shown) may be between the gate dielectric layers 162 and the first electrode layer 172*a*. In this case, the fourth electrode layer may be a layer having a constant thickness similar to that of the second electrode layer 174*a*, and may be formed in a process different from that of the first electrode layer 172*a*, and may be formed in the same process as the second electrode layer 174*a*.

Figure 5:
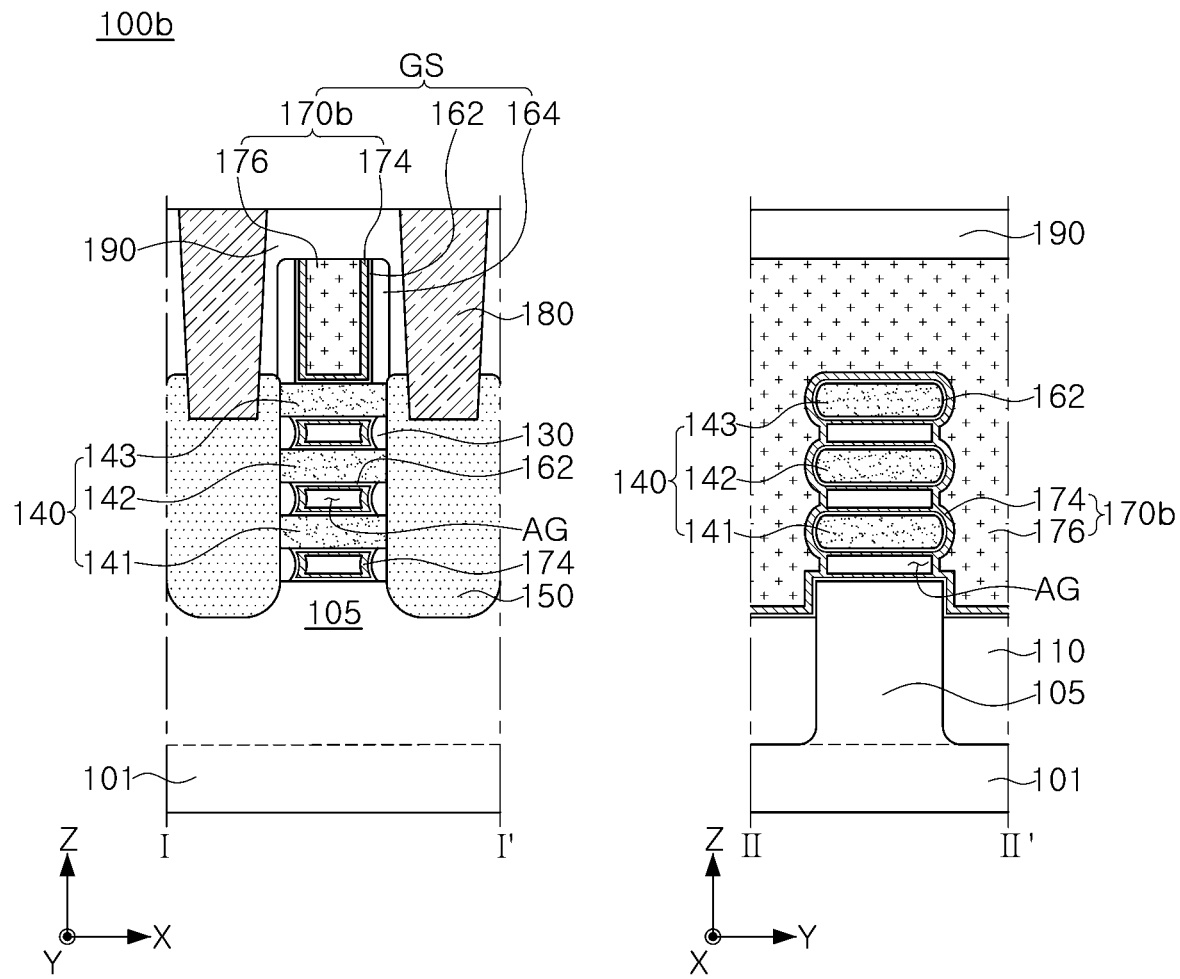
FIG. 5 includes schematic cross-sectional views illustrating a semiconductor device according to example embodiments.

FIG. 5 includes schematic cross-sectional views illustrating a semiconductor device according to example embodiments. FIG. 5 may include elements similar to those previously discussed. Thus, the same or similar reference numerals may be used to refer to the same or similar elements, and a description of those elements will not be repeated here.

Referring to FIG. 5, in a semiconductor device 100*b*, a gate electrode layer 170*b* may not include a layer corresponding to the first electrode layer 172 in the example embodiment of FIGS. 2 and 3. The gate electrode layer 170*b* may include a second electrode layer 174 and a third electrode layer 176. The second electrode layer 174 may be on gate dielectric layers 162, and as described above with reference to FIGS. 1 to 3, may have a reduced thickness between the first to third channel layers 141, 142, and 143 and on the upper surface of the active region 105.

Figure 6A:
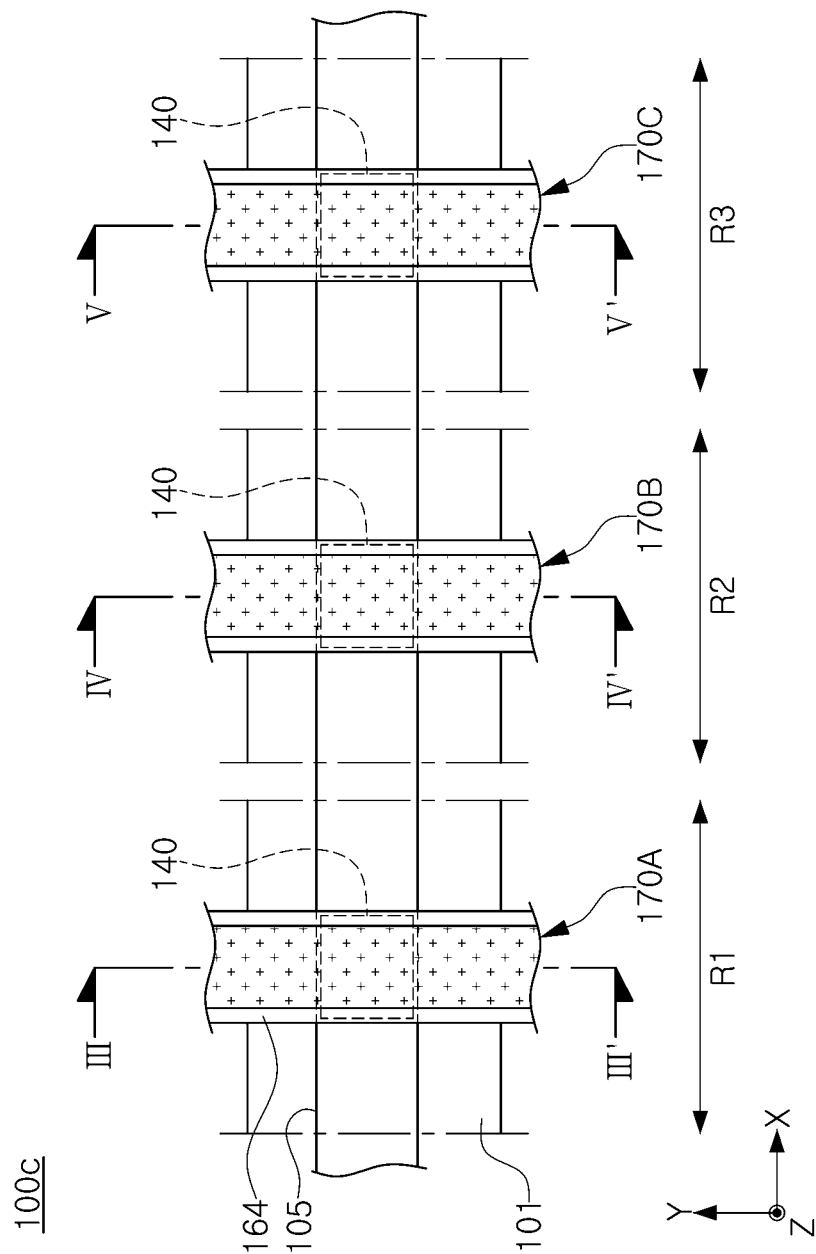
FIGS. 6A and 6B are a layout view and a schematic cross-sectional view illustrating a semiconductor device according to example embodiments, respectively.
Figure 6B:
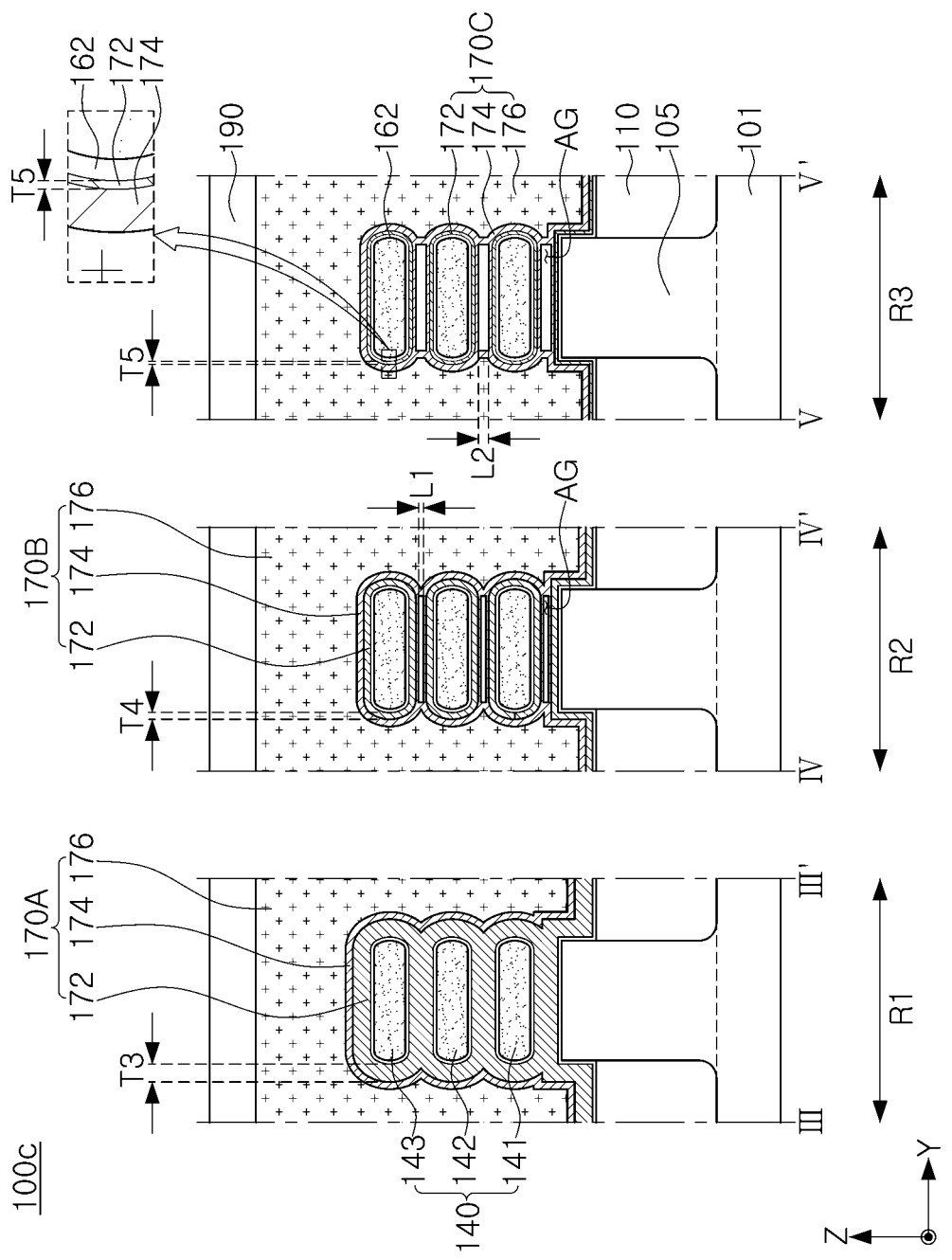

FIGS. 6A and 6B are a layout view and a schematic cross-sectional view illustrating a semiconductor device according to example embodiments, respectively. FIG. 6B illustrates cross-sections taken along lines III-III', IV-IV', and V-V' of FIG. 6A.

Referring to FIGS. 6A and 6B, in a semiconductor device 100*c*, a substrate 101 may have first to third regions R1, R2, and R3. The first to third regions R1, R2 and R3 may be areas adjacent to or spaced apart from each other, and may be areas in which first to third gate electrodes 170A, 170B, and 170C, each including respective first electrode layers 172 with different thicknesses, are disposed respectively.

First to third transistors including the first to third gate electrodes 170A, 170B, and 170C, respectively, may be transistors driven under different threshold voltages, and may constitute the same circuit or different circuits in the semiconductor device 100*c*. For example, when the first to third transistors are pFETs, a first transistor of the first region R1 may have a lowest threshold voltage and operating voltage, based on the absolute value, and a third region of the third transistor R3 may have a highest threshold voltage and operating voltage.

In each of the first to third regions R1, R2, and R3, each of the first electrode layers 172 may have a substantially uniform thickness. On the first region R1, the first electrode layer 172 has a third thickness T3, and on the second region R2, the first electrode layer 172 have a fourth thickness T4 less than a third thickness T3, and on the third region R3, the first electrode layer 172 may have a fifth thickness T5 less than the fourth thickness T4. The thicknesses may be, for example, an average thickness or thicknesses on corresponding locations. For example, the first electrode layer 172 of the first region R1 may be formed by depositing a preliminary first electrode layer three times, the first electrode layer 172 of the second region R2 may be formed by depositing the preliminary first electrode layer twice, and the first electrode layer 172 of the third region R3 may be formed by depositing the preliminary first electrode layer once. This structure of the first electrode layer 172 may be formed by the patterning that uses a protective layer deposited to a relatively thin thickness, between the first to third channel layers 141, 142 and 143, to have a form similar to that of the second electrode layers 174. This will be described in more detail below with reference to FIGS. 11A to 11G.

In the first region R1, air gap regions AG may not be located in the first gate electrode 170A. Accordingly, the first electrode layer 172 may be vertically connected to form one layer, and a space between the first to third channel layers 141, 142, and 143 may be at least partially filled with the first electrode layer 172. In the second and third regions R2 and R3, the air gap regions AG may be located in the second and third gate electrodes 170B and 170C, as described with reference to FIGS. 1 to 3.

The second electrode layer 174 may have the same average thickness in the first to third regions R1, R2, and R3, but the configuration is not limited thereto. In the first region R1, the second electrode layer 174 may extend toward the substrate 101 along the first electrode layer 172. As for the description of the second electrode layer 174 in the second and third regions R2 and R3, the description with reference to FIGS. 1 to 3 may be equally applied. In the example embodiments, since the thicknesses of the first electrode layer 172 are different from each other, when the thicknesses of the second electrode layers 174 are equal to each other, a height L1 in the Z-direction of the air gap regions AG in the second region R2 may be less than a height L2 in the Z-direction of the air gap regions AG in the third region R3. In some embodiments, the semiconductor device 100*c* may include only two of the first to third regions R1, R2, and R3.

Figure 7:
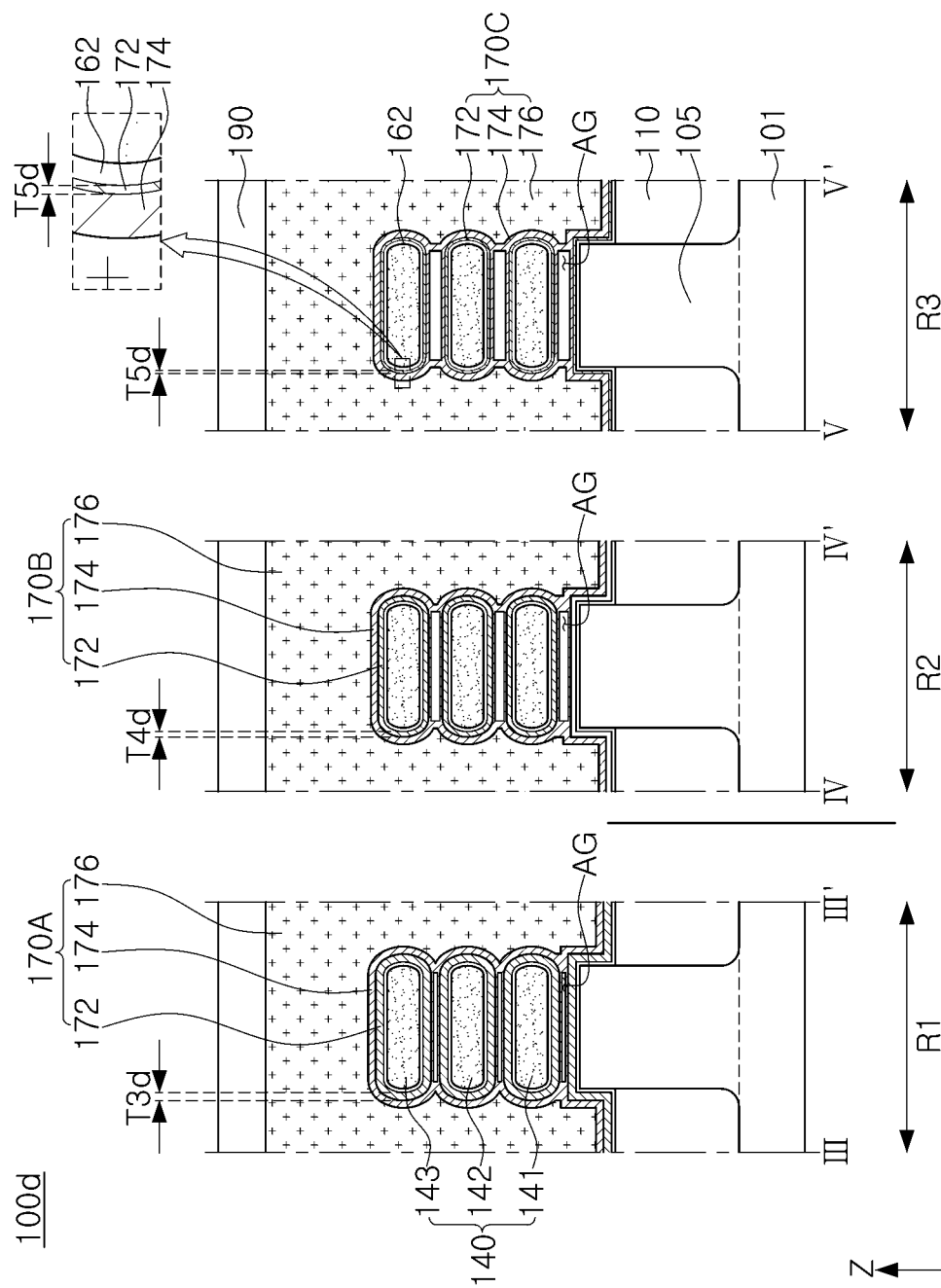
FIG. 7 includes schematic cross-sectional views illustrating a semiconductor device according to example embodiments.

FIG. 7 includes schematic cross-sectional views illustrating a semiconductor device according to example embodiments. FIG. 7 may include elements similar to those previously discussed. Thus, the same or similar reference numerals may be used to refer to the same or similar elements, and a description of those elements will not be repeated here.

Referring to FIG. 7, in a semiconductor device 100*d*, unlike the example embodiment of FIG. 6B, air gap regions AG may be located in a first gate electrode 170A in the first region R1. Also in this embodiment, the first electrode layer 172 on the first region R1 may have a third thickness T3*d*, the first electrode layer 172 on the second region R2 may have a fourth thickness T4*d* less than the third thickness T3*d*, and the first electrode layer 172 on the third region R3 may have a fifth thickness T5*d* that is less than the fourth thickness T4*d*. In some embodiments, the semiconductor device 100*d* may include only two of the first to third regions R1, R2, and R3.

As such, in example embodiments, the presence or absence of the air gap regions AG according to the region may be changed depending on a separation distance between the first to third channel layers 141, 142, and 143 and a relative thickness of the first electrode layer 172.

Figure 8:
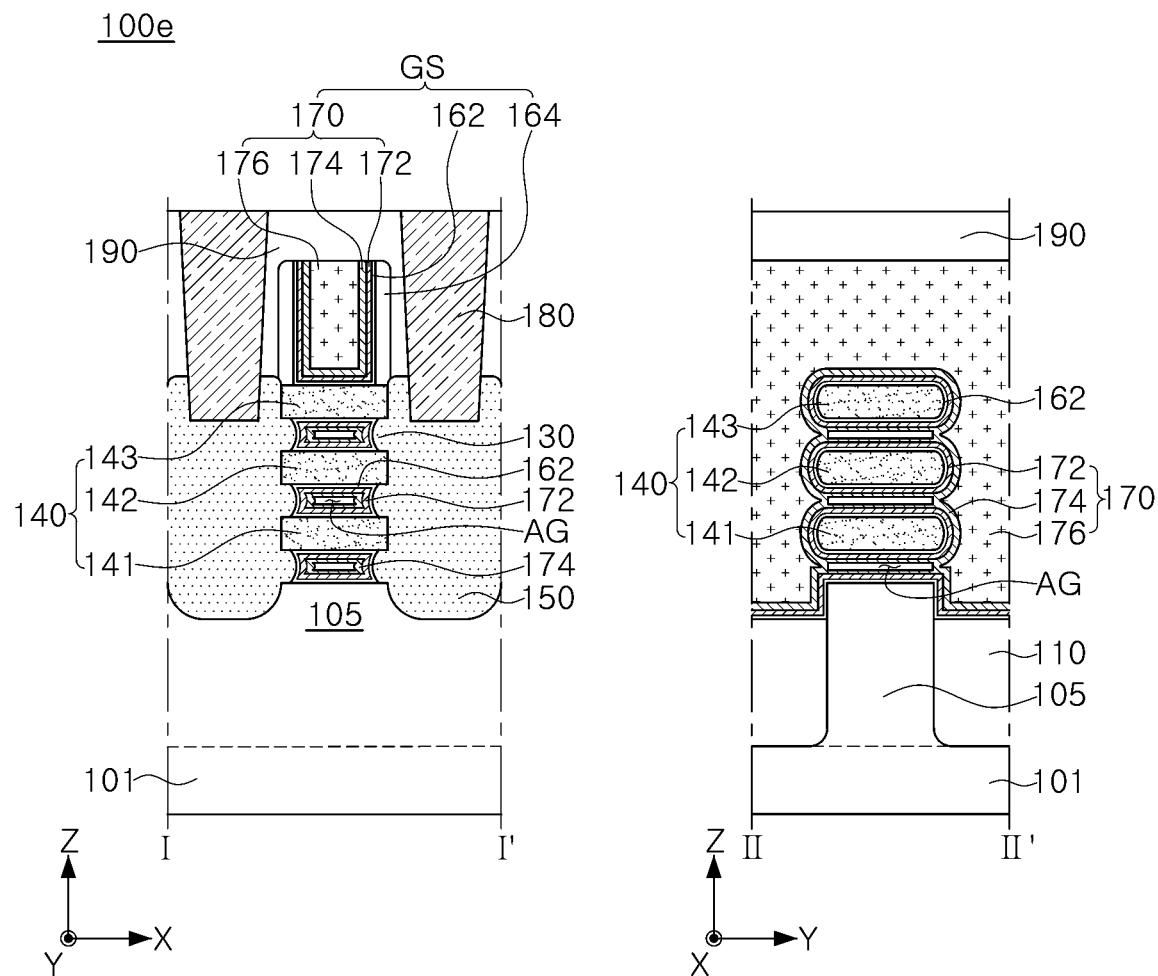
FIG. 8 includes schematic cross-sectional views illustrating a semiconductor device according to example embodiments.

FIG. 8 includes schematic cross-sectional views illustrating a semiconductor device according to example embodiments. FIG. 8 may include elements similar to those previously discussed. Thus, the same or similar reference numerals may be used to refer to the same or similar elements, and a description of those elements will not be repeated here.

Referring to FIG. 8, a semiconductor device 100e may not include the inner spacer layer 130, unlike the example embodiment of FIGS. 2 and 3. In this case, the source/drain regions 150 may expand to regions in which the inner spacer layers 130 are omitted, to have an expanded shape. The gate electrode 170 may be spaced apart from the source/drain regions 150 by the gate dielectric layers 162. In another embodiment, the source/drain regions 150 may not expand to the region in which the inner spacer layers 130 are omitted, but the gate electrode 170 may expand in the X-direction.

According to this structure, when the inner spacer layer 130 is omitted and the source/drain regions 150 are grown, the source/drain regions 150 may have improved crystallinity. In some embodiments, the inner spacer layer 130 may be omitted only in some devices of the semiconductor device 100e. For example, when SiGe is used for the source/drain regions 150 in a pFET, the inner spacer layer 130 may be selectively omitted only in the pFET to improve the crystallinity of SiGe.

Figure 9:
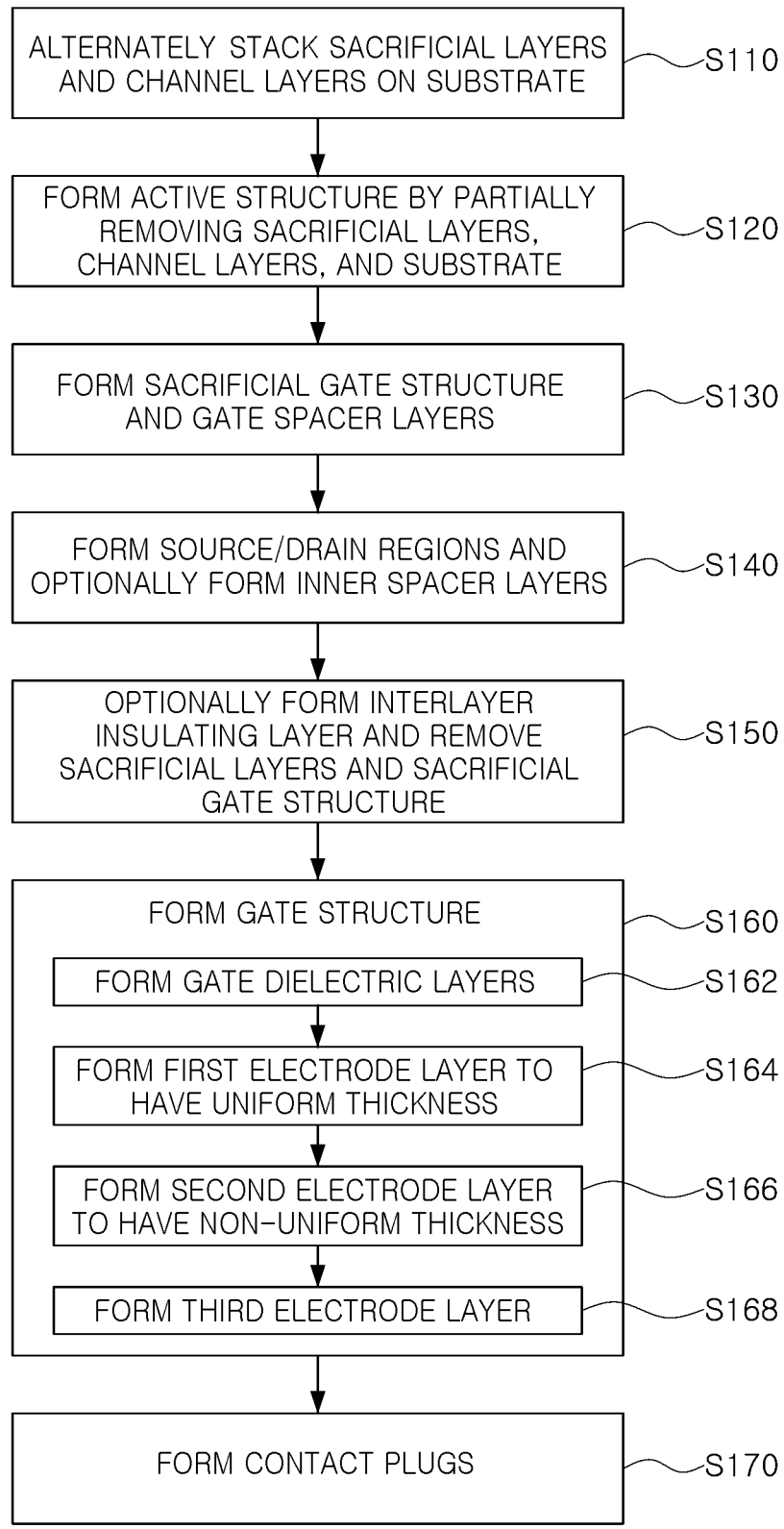
FIG. 9 is a flowchart illustrating a method of manufacturing a semiconductor device according to example embodiments.

FIG. 9 is a flowchart illustrating a method of manufacturing a semiconductor device according to example embodiments.

FIGS. 10A to 10H are views illustrating a process sequence to illustrate a method of manufacturing a semiconductor device according to example embodiments. An example embodiment of a method of manufacturing the semiconductor device of FIGS. 1 to 3 is described with reference to FIGS. 10A to 10H.

Figure 10A:
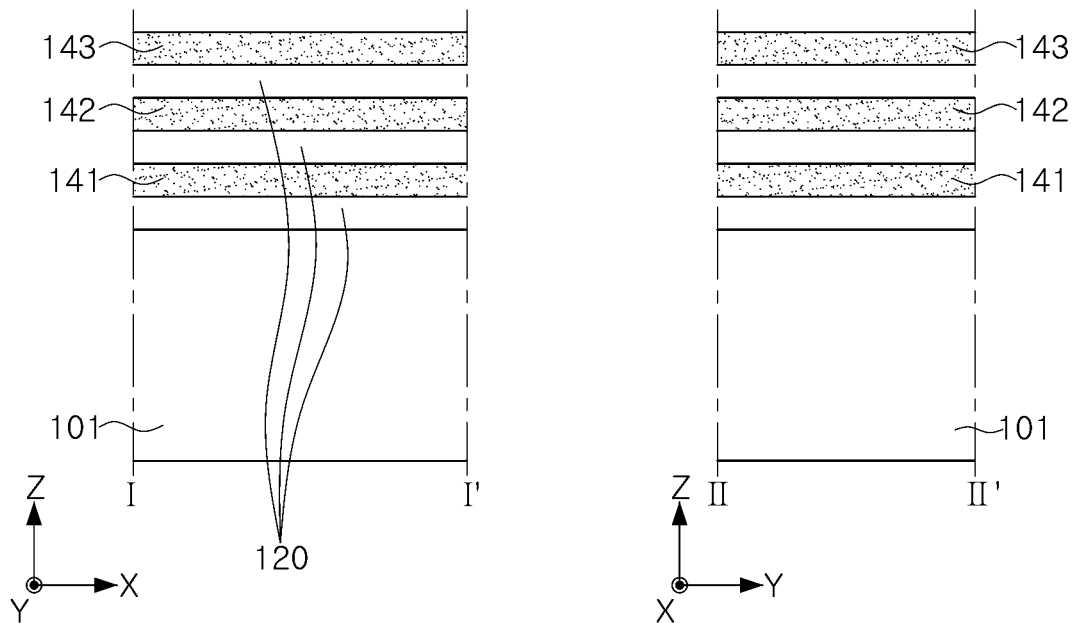
FIGS. 10A to 10H are views illustrating a process sequence to illustrate a method of manufacturing a semiconductor device according to example embodiments.

Referring to FIGS. 9 and 10A, sacrificial layers 120 and first to third channel layers 141, 142, and 143 may be alternately stacked on a substrate 101 (S110).

The sacrificial layers 120 may be the layers replaced by the gate dielectric layers 162 and the gate electrode 170 as illustrated in FIG. 2 through a subsequent process. The sacrificial layers 120 may be formed of a material respectively having etch selectivity with respect to the first to third channel layers 141, 142, and 143. The first to third channel layers 141, 142, and 143 may include a material different from that of the sacrificial layers 120. The sacrificial layers 120 and the first to third channel layers 141, 142, and 143 may include a semiconductor material including at least one of silicon (Si), silicon germanium (SiGe), and germanium (Ge), but may include different materials, and may or may not contain impurities. For example, the sacrificial layers 120 may include silicon germanium (SiGe), and the first to third channel layers 141, 142, and 143 may include silicon (Si).

The sacrificial layers 120 and the first to third channel layers 141, 142, and 143 may be formed by performing an epitaxial growth process from the substrate 101. Each of the sacrificial layers 120 and the first to third channel layers 141, 142, and 143 may have a thickness in a range of about one Angstrom (1 Å) to about one hundred (100) nm. The number of layers of the channel layers 141, 142, and 143 alternately stacked with the sacrificial layers 120 may be variously changed in example embodiments.

Figure 10B:
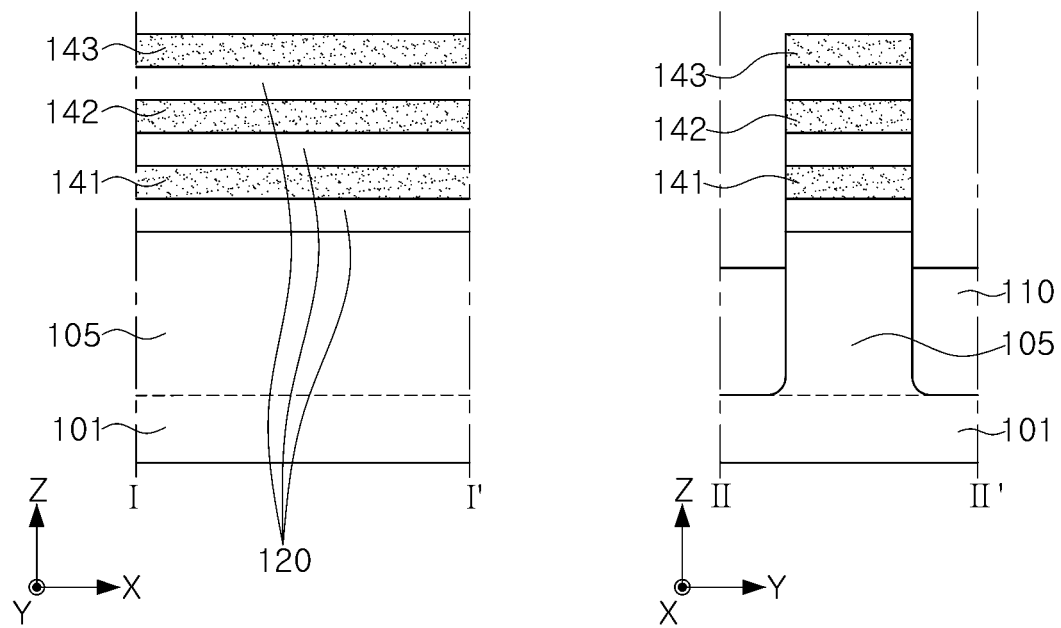

Referring to FIGS. 9 and 10B, an active structure may be formed by removing portions of the sacrificial layers 120, the first to third channel layers 141, 142 and 143, and the substrate 101, and the device isolation layer 110 may be formed (S120).

The active structure may include the sacrificial layers 120 and the first to third channel layers 141, 142, and 143 stacked alternately with each other, and may further include the active region 105 that is formed to extend from the substrate 101 by removing a portion of the substrate 101. The active structure may be formed in the form of a line extending in one direction, for example, the X-direction, and the active structures may be formed to be spaced apart from each other in the Y-direction.

In the region from which a portion of the substrate 101 has been removed, the insulating material is partially or completely filled, and then, the insulating material is partially removed such that the active region 105 protrudes, thereby forming the device isolation layer 110. The upper surface of the device isolation layer 110 may be formed to be lower than the upper surface of the active region 105.

Figure 10C:
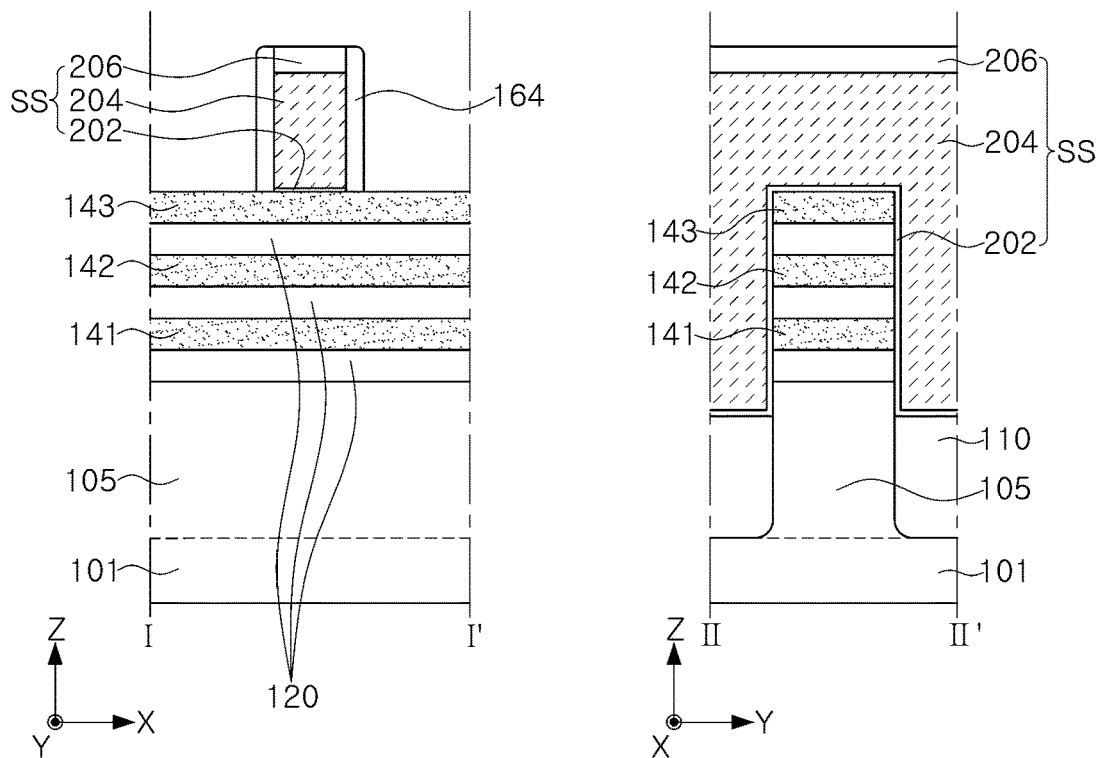

Referring to FIGS. 9 and 10C, a sacrificial gate structure SS and gate spacer layers 164 may be formed on the active structure (S130).

The sacrificial gate structure SS may be a sacrificial structure formed in a region in which the gate dielectric layers 162 and the gate electrode 170 are disposed, on the channel structure 140 through a subsequent process, as illustrated in FIG. 2. The sacrificial gate structure SS may include first and second sacrificial gate layers 202 and 204 and a mask pattern layer 206 that are sequentially stacked. The first and second sacrificial gate layers 202 and 204 may be patterned using a mask pattern layer 206. The first and second sacrificial gate layers 202 and 204 may be an insulating layer and a conductive layer, respectively, but are not limited thereto, and the first and second sacrificial gate layers 202 and 204 may also be formed as a single layer. For example, the first sacrificial gate layer 202 may include silicon oxide, and the second sacrificial gate layer 205 may include polysilicon. The mask pattern layer 206 may include silicon oxide and/or silicon nitride. The sacrificial gate structure SS may have a line shape that intersects the active structures and extends in one direction. The sacrificial gate structure SS may extend in, for example, a Y-direction, and may be spaced apart from a sacrificial gate structure SS adjacent thereto in the X-direction.

The gate spacer layers 164 may be formed on both sidewalls of the sacrificial gate structure SS. The gate spacer layers 164 may be formed of a low-k material, and may include, for example, at least one of SiO, SiN, SiCN, SiOC, SiON, and SiOCN.

Figure 10D:
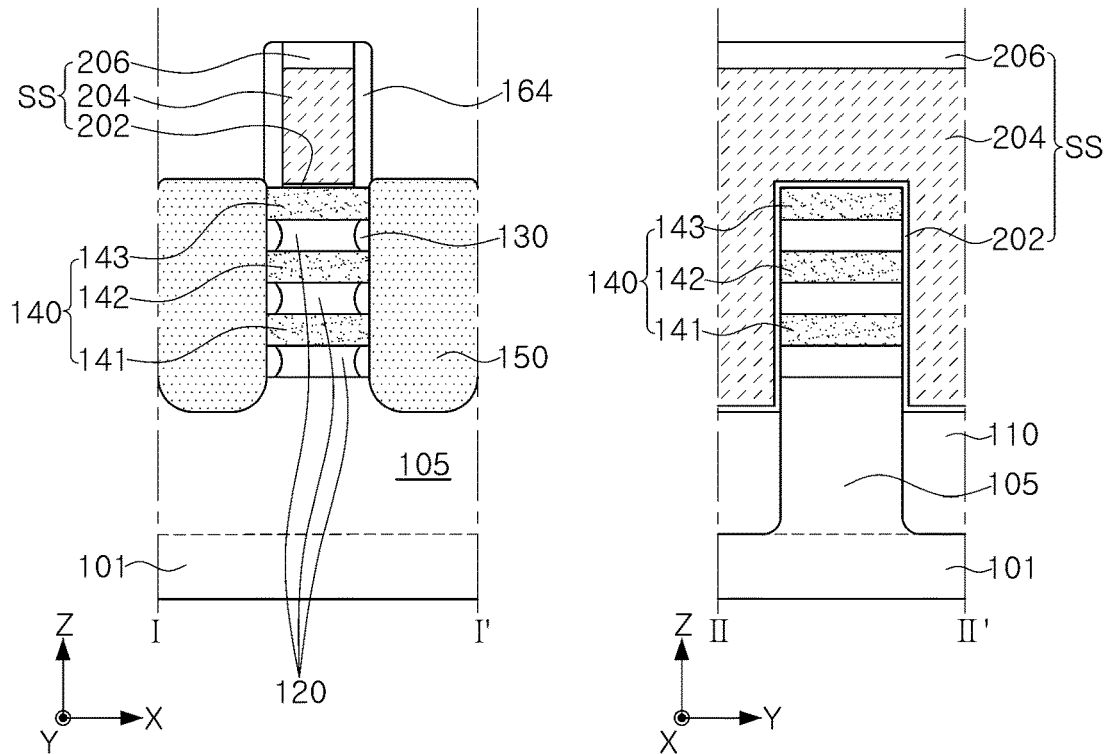

Referring to FIGS. 9 and 10D, on the outside of the sacrificial gate structure SS, the exposed sacrificial layers 120 and first to third channel layers 141, 142, and 143 may be partially removed to form recess regions, inner spacer layers 130 may be formed, and source/drain regions 150 partially or completely filling the recess regions may be formed (S140).

First, the exposed sacrificial layers 120 and first to third channel layers 141, 142, and 143 are removed using the sacrificial gate structure SS and the gate spacer layers 164 as masks, thereby forming recess regions. Accordingly, the first to third channel layers 141, 142, and 143 may form the channel structure 140 having a limited length in the X-direction.

Next, portions of the sacrificial layers 120 may be removed. The sacrificial layers 120 may be selectively etched with respect to the channel structure 140 by, for example, a wet etching process, and may be removed to a predetermined depth from the side surface in the X-direction. The sacrificial layers 120 may have inwardly concave side surfaces by side etching as described above. However, the shape of the side surfaces of the sacrificial layers 120 is not limited to the illustration.

Next, the inner spacer layers 130 may be formed in the regions from which the sacrificial layers 120 have been partially removed. The inner spacer layers 130 may be formed of the same material as the gate spacer layers 164, but the material is not limited thereto. For example, the inner spacer layers 130 may include at least one of SiN, SiCN, SiOCN, SiBCN, and SiBN.

Next, the source/drain regions 150 may be formed by growing from the upper surface of the active region 105 and side surfaces of the channel structure 140, for example, by a selective epitaxial process. The source/drain regions 150 may include impurities by in-situ doping, and may also include a plurality of layers having different doping elements and/or doping concentrations.

Figure 10E:
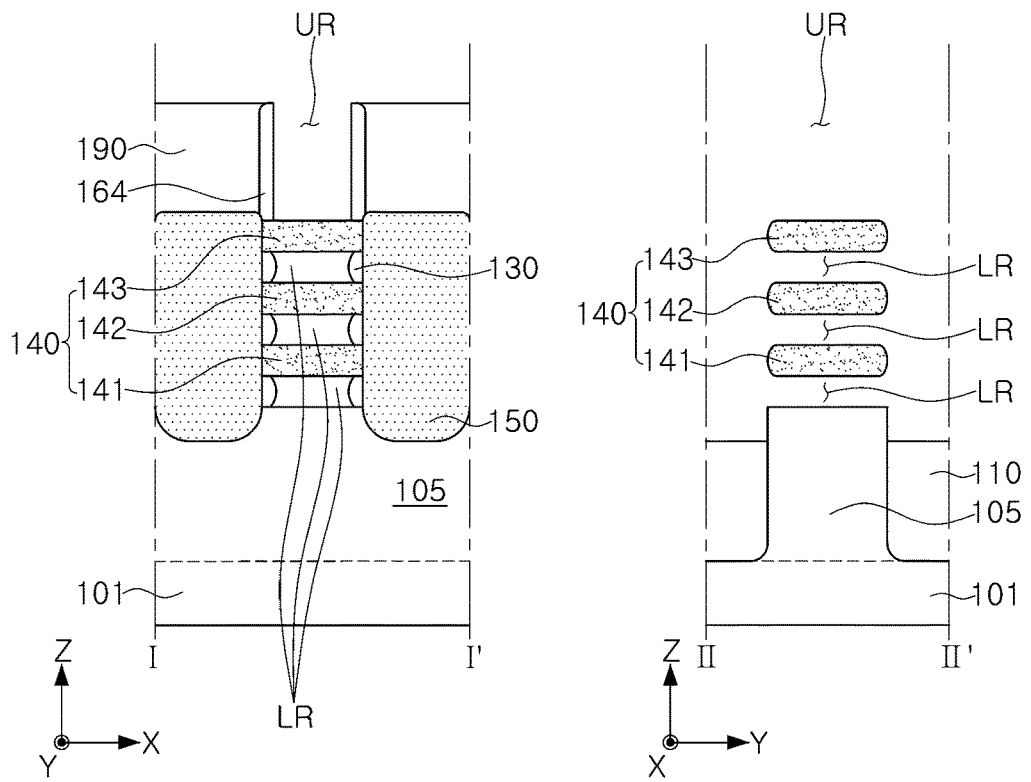

Referring to FIGS. 9 and 10E, after the interlayer insulating layer 190 is formed, the sacrificial layers 120 and the sacrificial gate structure SS may be removed (S150).

The interlayer insulating layer 190 may be formed by forming an insulating layer at least partially covering the sacrificial gate structure SS and the source/drain regions 150 and performing a planarization process.

The sacrificial layers 120 and the sacrificial gate structure SS may be selectively removed with respect to the gate spacer layers 164, the interlayer insulating layer 190, and the channel structure 140. First, the sacrificial gate structure SS is removed to form an upper gap region UR, and lower gap regions LR may be formed by removing the sacrificial layers 120 exposed through the upper gap region UR. For example, when the sacrificial layers 120 include silicon germanium (SiGe) and the channel structures 140 include silicon (Si), the sacrificial layers 120 may be selectively removed by performing a wet etching process using peracetic acid as an etchant. During the removal process, the source/drain regions 150 may be protected by the interlayer insulating layer 190 and the inner spacer layers 130.

Hereinafter, operation (S160) of forming the gate structure 160 will be described with reference to FIGS. 9 and 10F to 10H.

Figure 10F:
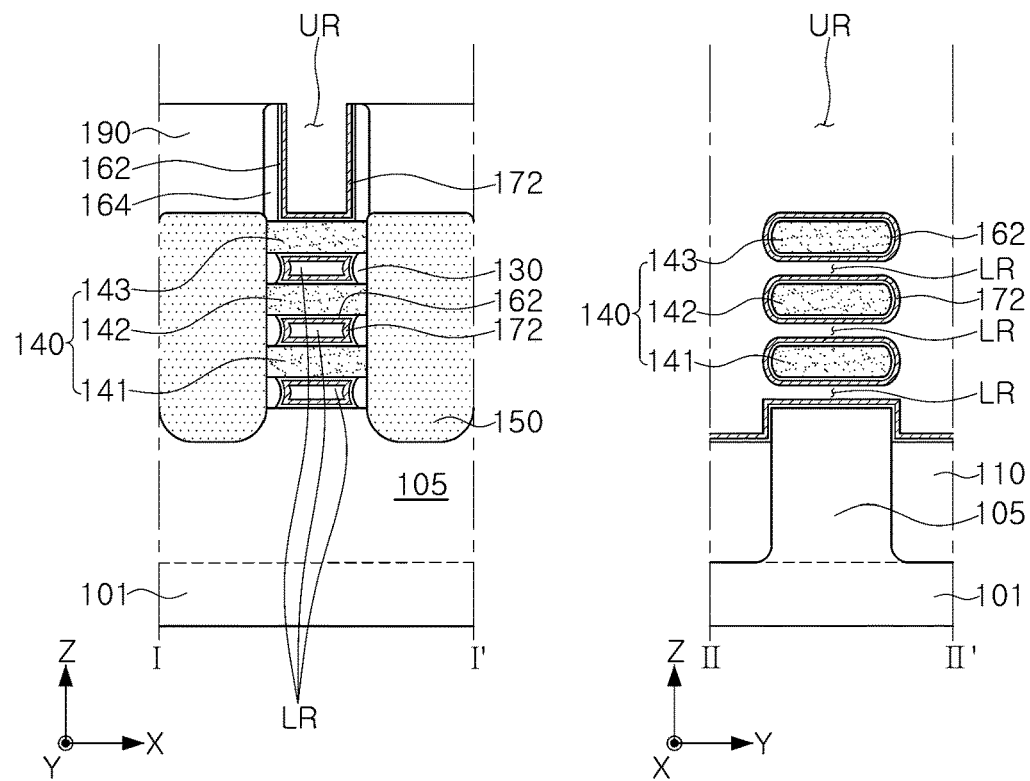

First, referring to FIGS. 9 and 10F, the gate dielectric layers 162 may be formed (S162), and the first electrode layer 172 may be formed to have a uniform thickness (S164).

The gate dielectric layers 162 may be formed to conform to, and at least partially cover, inner surfaces of the upper gap region UR and the lower gap regions LR.

The first electrode layer 172 may be formed to conform to, and at least partially cover, the gate dielectric layers 162 in the upper gap region UR and the lower gap regions LR. For example, the first electrode layer 172 may be formed to have a uniform thickness using thermal atomic layer deposition. The first electrode layer 172 may be formed to have a substantially uniform thickness on a circumference of the channel structure 140. The size of air gap regions AG (refer to FIG. 10G) to be formed subsequently may be adjusted by the thickness of the first electrode layer 172.

Figure 10G:
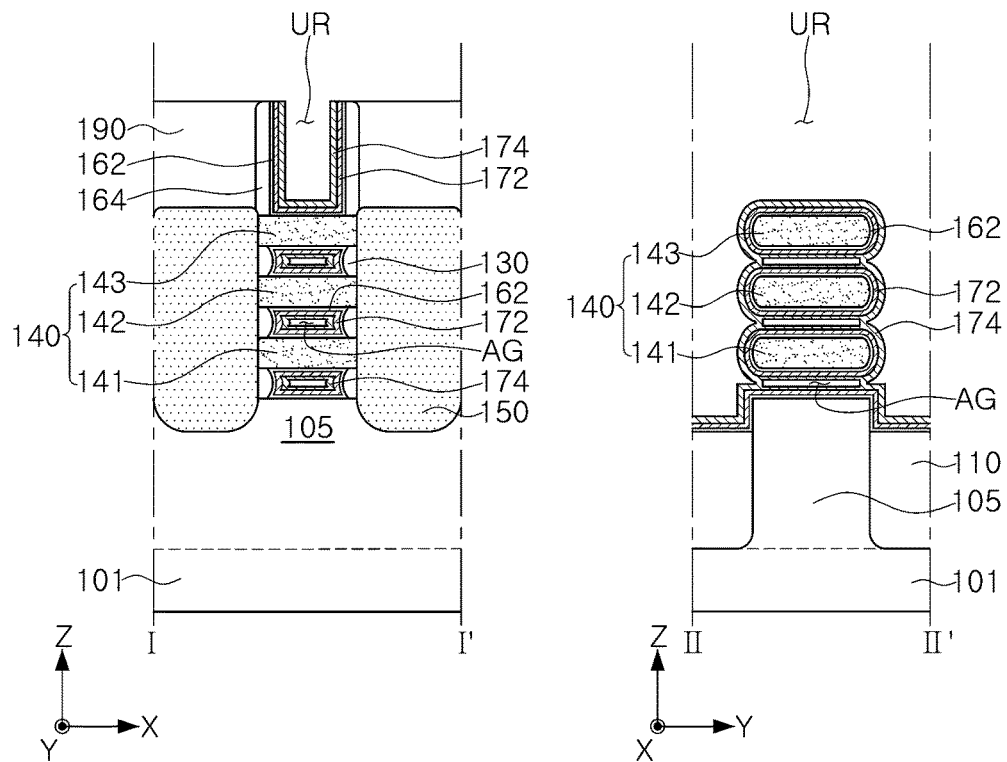

Referring to FIGS. 9 and 10G, the second electrode layer 174 may be formed to have a non-uniform thickness (S166).

The second electrode layer 174 may surround the first electrode layer 172 in the upper gap region UR and the lower gap regions LR and extend onto the active region 105 and the device isolation layer 110. The second electrode layer 174 may be formed to completely fill the lower gap regions LR in some embodiments.

The second electrode layer 174 may be formed by using a different deposition process from that of the first electrode layer 172. For example, the second electrode layer 174 may be formed to have a non-uniform thickness using a plasma-enhanced atomic layer deposition (PEALD) method. This may be because, in the PEALD process, the deposition material is directionally supplied and deposited by plasma.

The second electrode layer 174 is formed to be relatively thin in a region extending horizontally between the channel structures 140 and between the first channel layer 141 and the active region 105, and to be relatively thick in other regions.

Between the first to third channel layers 141, 142 and 143 and between the first channel layer 141 and the active region 105, the second electrode layer 174 may be deposited to a thickness that does not fill the spaces between the first to third channel layers 141, 142, and 143. Accordingly, the air gap regions AG may be formed between the first to third channel layers 141, 142, and 143 and between the first channel layer 141 and the active region 105. The size of the air gap regions AG may also be adjusted by the thickness of the second electrode layer 174. In example embodiments, the relative thicknesses of the first electrode layer 172 and the second electrode layer 174 may be variously changed.

In the case of the example embodiment of FIGS. 4A and 4B, in contrast to the present embodiment, the first electrode layer 172a may be formed by PEALD, and then the second electrode layer 174a may be formed by thermal ALD.

Figure 10H:
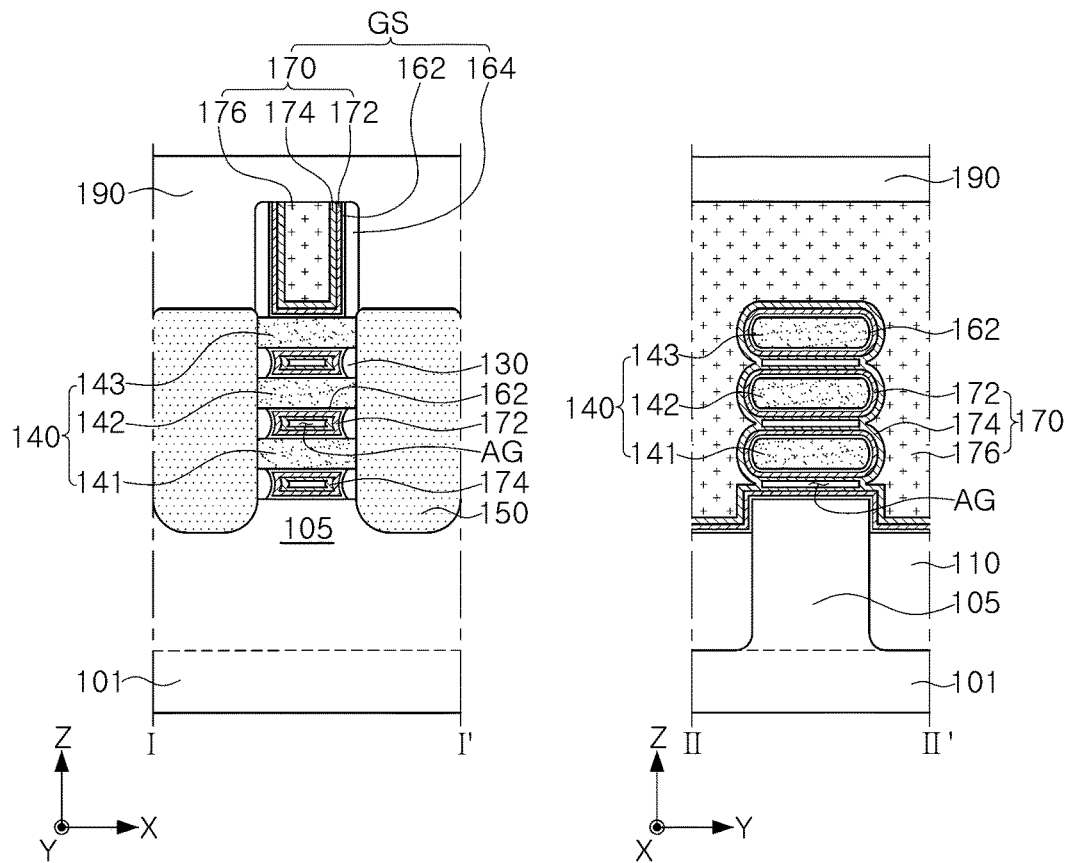

Referring to FIGS. 9 and 10H, a third electrode layer 176 may be formed (S168).

The third electrode layer 176 may be formed on the second electrode layer 174 in the upper gap region UR, and may be formed to completely fill the upper gap region UR in some embodiments. Accordingly, the gate structure GS may be formed. The third electrode layer 176 may be formed to have a substantially flat upper surface by a planarization process or the like. In some embodiments, the third electrode layer 176 may include a plurality of conductive layers.

Next, an interlayer insulating layer 190 may be further formed on the gate structure GS.

Next, referring to FIG. 2, contact plugs 180 may be formed (S170).

First, the interlayer insulating layer 190 may be patterned to form contact holes exposing the source/drain regions 150. Contact plugs 180 may be formed by partially or completely filling the contact holes with a conductive material. In detail, after depositing a material forming a barrier layer in the contact holes, a silicide process may be performed to form a metal-semiconductor compound layer such as a silicide layer on a lower end. Next, a conductive material may be deposited to partially or completely fill the contact holes to form the contact plugs 180. Accordingly, the semiconductor device 100 of FIGS. 1 to 3 may be manufactured.

FIGS. 11A to 11G are diagrams illustrating a process sequence to illustrate a method of manufacturing a semiconductor device according to example embodiments. An example embodiment of a method of manufacturing the semiconductor device of FIGS. 6A and 6B will be described with reference to FIGS. 11A to 11G. FIGS. 11A-11G may include elements similar to those previously discussed. Thus, the same or similar reference numerals may be used to refer to the same or similar elements, and a description of those elements will not be repeated here.

Figure 11A:
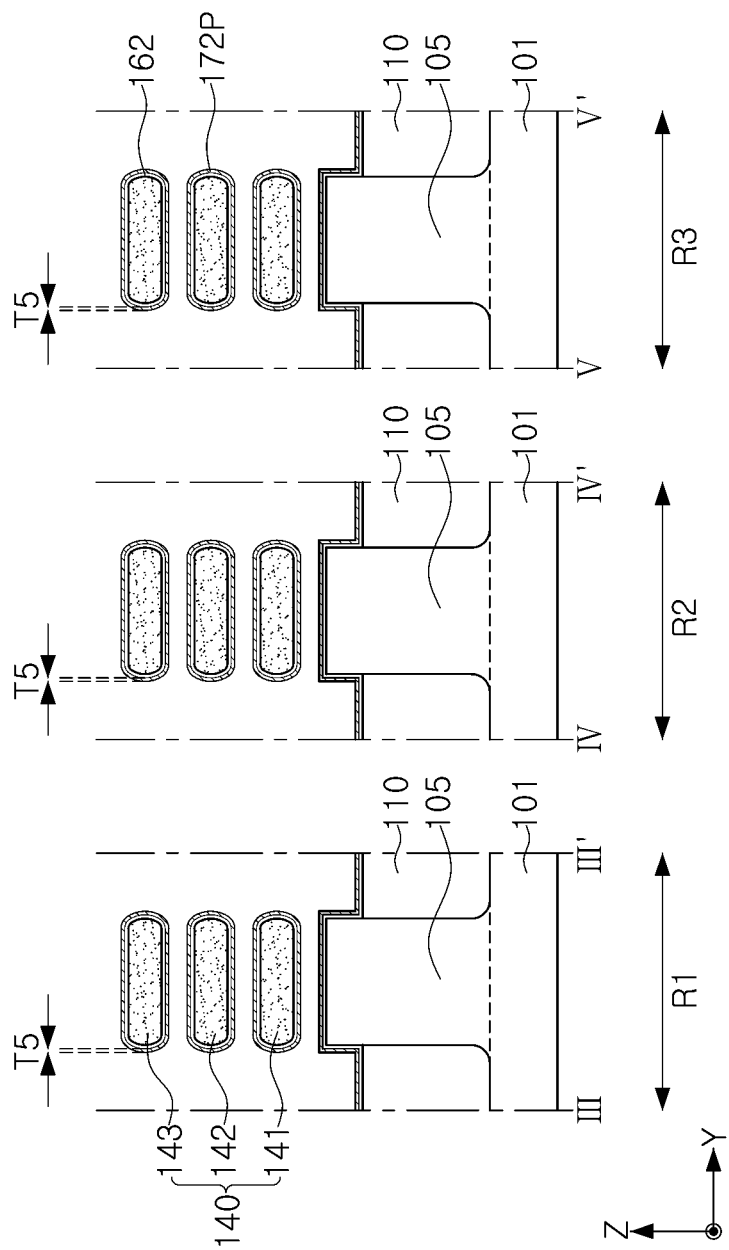
FIGS. 11A to 11G are diagrams illustrating a process sequence to illustrate a method of manufacturing a semiconductor device according to example embodiments.

Referring to FIG. 11A, in the first to third regions R1, R2 and R3, the operations described above with reference to FIGS. 10A to 10E are performed in the same manner, and after forming the upper gap region UR and the lower gap regions LR, preliminary first electrode layer 172P may be formed.

The preliminary first electrode layer 172P may be formed to conform to, and at least partially cover, the gate dielectric layers 162 in the upper gap region UR and the lower gap regions LR in the first to third regions R1, R2, and R3. In this operation, the preliminary first electrode layer 172P may be formed to have a fifth thickness T5. In the following embodiments of the manufacturing method, a case in which a ratio (T3:T4:T5) of the third thickness (T3), the fourth thickness (T4), and the fifth thickness (T5) of FIG. 6B is 3:2:1 will be described. However, the ratio (T3:T4:T5) is not limited thereto.

Figure 11B:
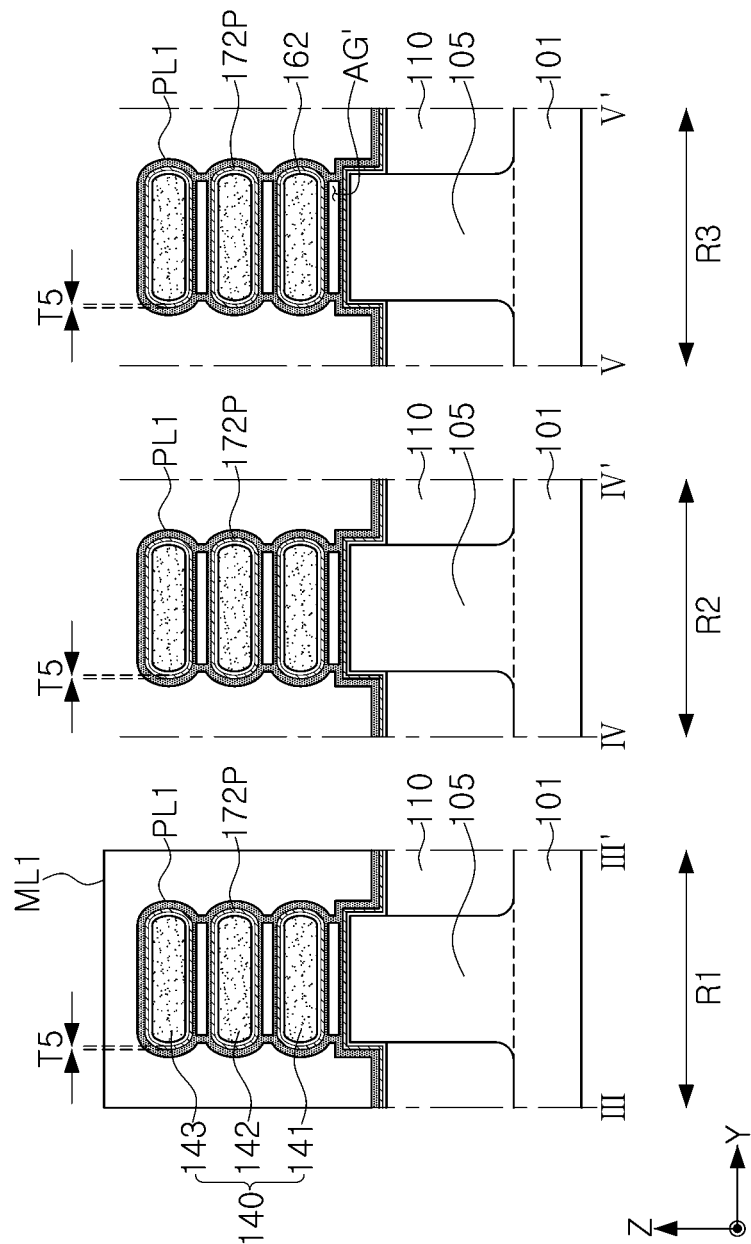

Referring to FIG. 11B, a first protective layer PL1 may be formed in the first to third regions R1, R2, and R3, and a first mask layer ML1 may be formed in the first region R1.

The first protective layer PL1 may be nonconformally formed, while surrounding the preliminary first electrode layer 172P. The first protective layer PL1 may include, for example, at least one of aluminum oxide (AlOx), titanium oxide (TiOx), and titanium nitride (TiN). The first protective layer PL1 may be formed in the same manner as the second electrode layer 174 described above with reference to FIG. 10G. For example, the first protective layer PL1 may be formed to have a non-uniform thickness using PEALD. The first protective layer PL1 is formed to be relatively thin in a region extending horizontally between the channel structures 140 and between the first channel layer 141 and the active region 105, and may be formed to be relatively thick in other regions. Accordingly, between the first to third channel layers 141, 142 and 143 and between the first channel layer 141 and the active region 105, air gap regions AG' may be formed in the first protective layer PL1.

The first mask layer ML1 may be formed to at least partially cover the first region R1. The first mask layer ML1 may be, for example, a photoresist layer, but is not limited thereto.

Figure 11C:
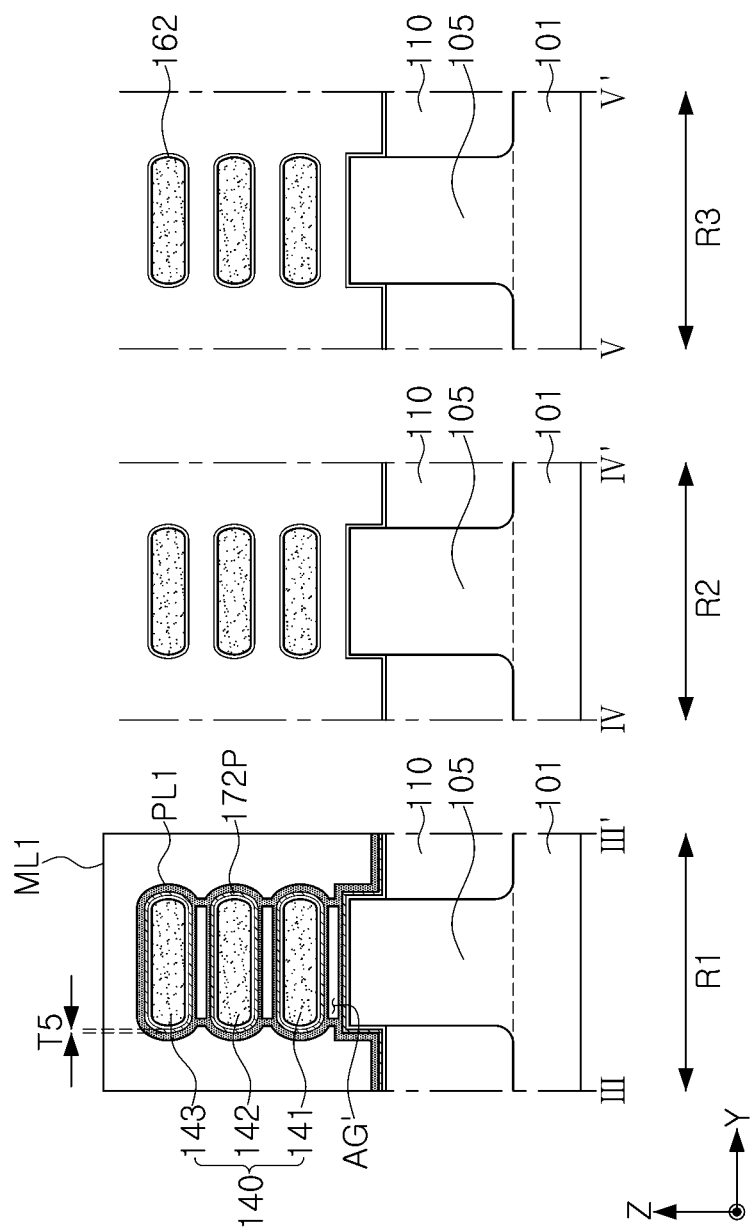

Referring to FIG. 11C, the first protective layer PL1 and the preliminary first electrode layer 172P may be removed from the second and third regions R2 and R3.

The first protective layer PL1 may be removed from the second and third regions R2 and R3 exposed from the first mask layer ML1, thereby removing the exposed preliminary first electrode layer 172P. Accordingly, the preliminary first electrode layer 172P may remain only in the first region R1.

In this operation, since the air gap regions AG' are formed in the first protective layer PL1, the path of the etchant is secured, and a defect in which the first protective layer PL1 remains between the first to third channel layers 141, 142, and 143 and between the first channel layer 141 and the active region 105 may be prevented.

Figure 11D:
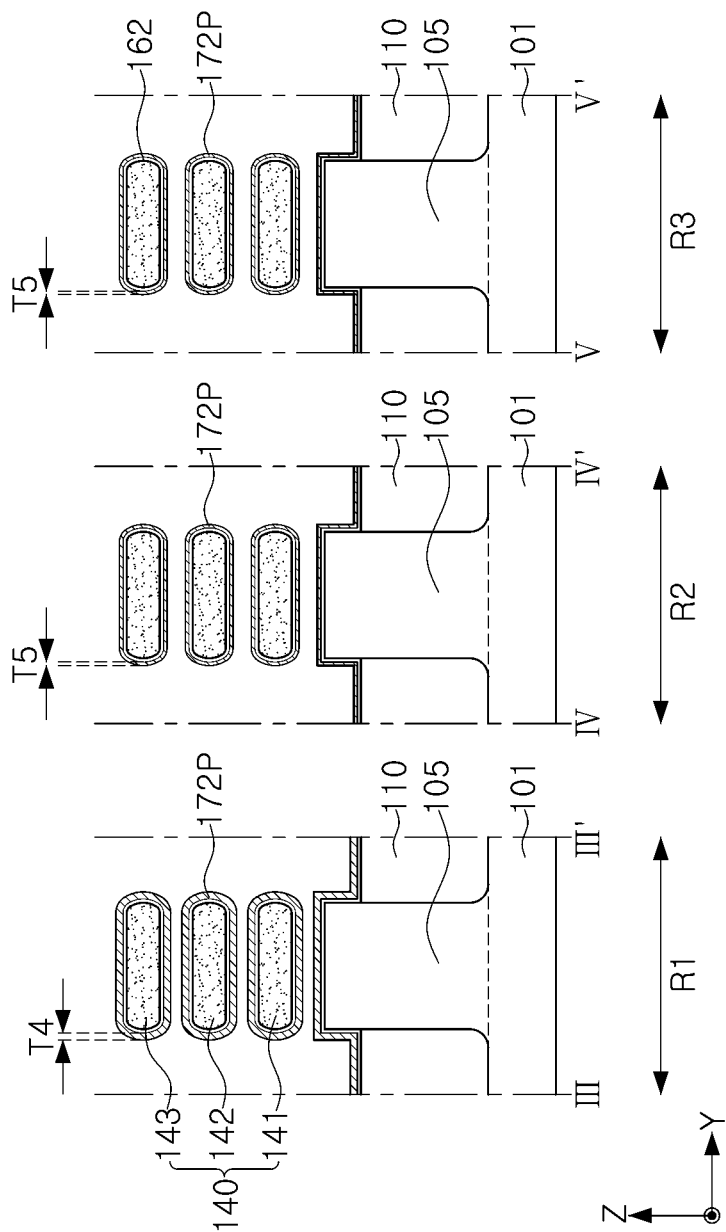

Referring to FIG. 11D, the first mask layer ML1 and the first protective layer PL1 may be removed from the first region R1, and preliminary first electrode layer 172P may be additionally formed in the first to third regions R1, R2, and R3.

First, the first mask layer ML1 and the first protective layer PL1 may be sequentially removed from the first region R1 to expose the preliminary first electrode layer 172P. In this operation, since the air gap regions AG' are formed in the first protective layer PL1, the path of the etchant is secured, and thus, defects in which the first protective layer PL1 remains between the first to third channel layers 141, 142, and 143 and between the first channel layer 141 and the active region 105, or in which lower preliminary first electrode layers 172P are damaged, may be prevented.

Next, preliminary first electrode layer 172P may be additionally formed in the entire first to third regions R1, R2, and R3. In this operation, the preliminary first electrode layer 172P may be further formed with a fifth thickness T5. Accordingly, in the first region R1, the preliminary first electrode layer 172P have a fourth thickness T4 that is twice the fifth thickness T5, and in the second and third regions R2 and R3, the preliminary first electrode layer 172P may have the fifth thickness T5.

Figure 11E:
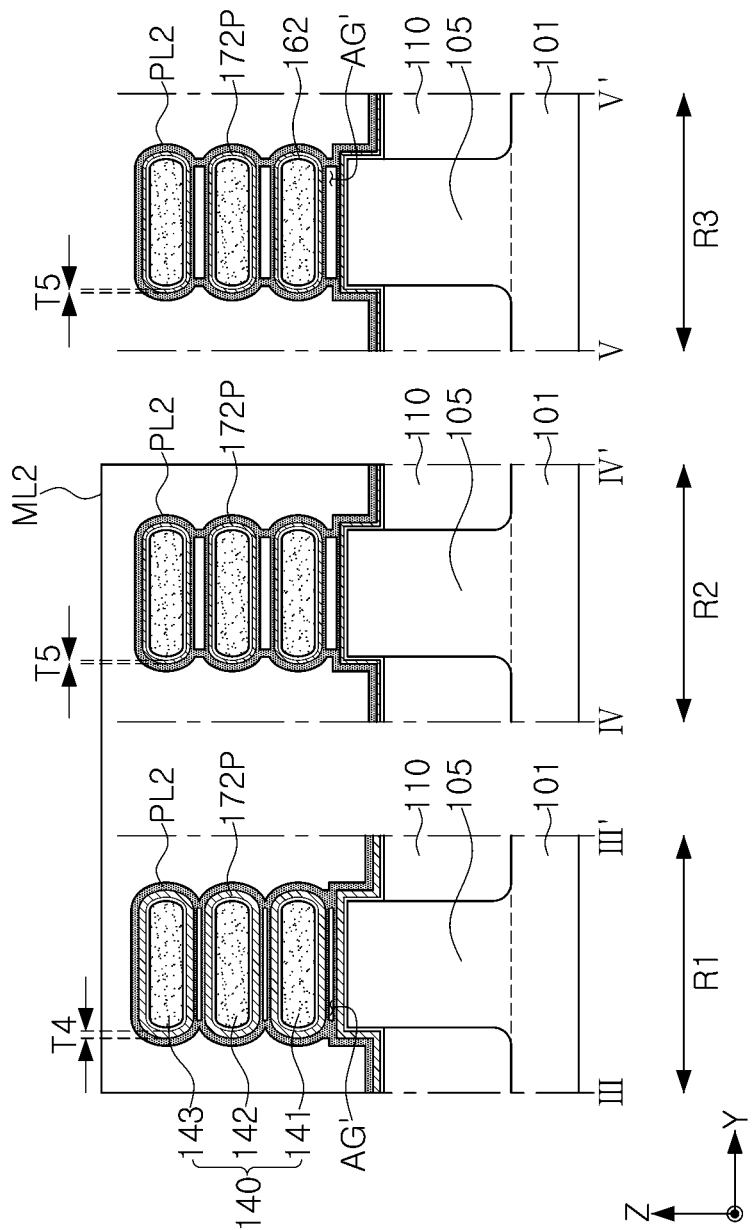

Referring to FIG. 11E, a second protective layer PL2 may be formed in the first to third regions R1, R2 and R3, and a second mask layer ML2 may be formed in the first and second regions R1 and R2.

The second mask layer ML2 may be formed to expose the third region R3. The second protective layer PL2 and the second mask layer ML2 may be formed in the same manner as the first protective layer PL1 and the first mask layer ML1 described above with reference to FIG. 11B, respectively.

Figure 11F:
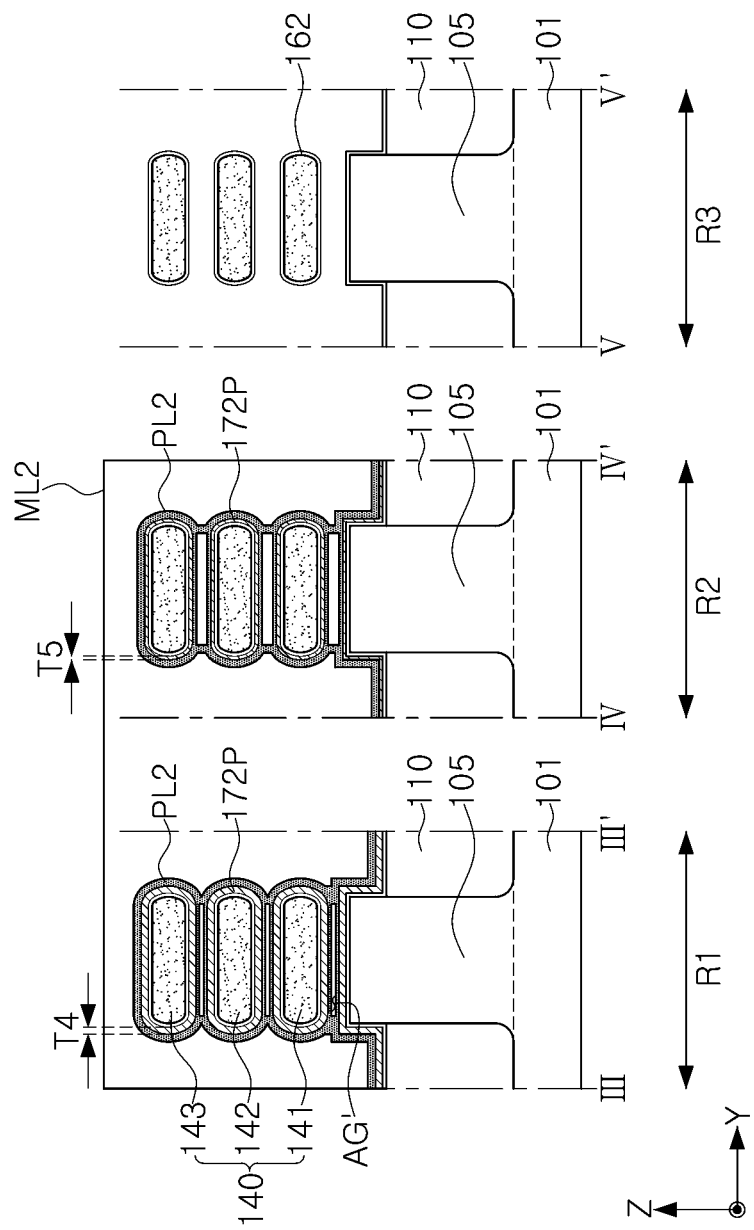

Referring to FIG. 11F, the second protective layer PL2 and the preliminary first electrode layer 172P may be removed from the third region R3.

The second protective layer PL2 may be removed from the third region R3 exposed from the second mask layer ML2, thereby removing the exposed preliminary first electrode layer 172P. Accordingly, in the first region R1, the preliminary first electrode layer 172P have a fourth thickness T4, and in the second region R2, the preliminary first electrode layer 172P have a fifth thickness T5, and the preliminary first electrode layer 172P may not remain in the third region R3.

Figure 11G:
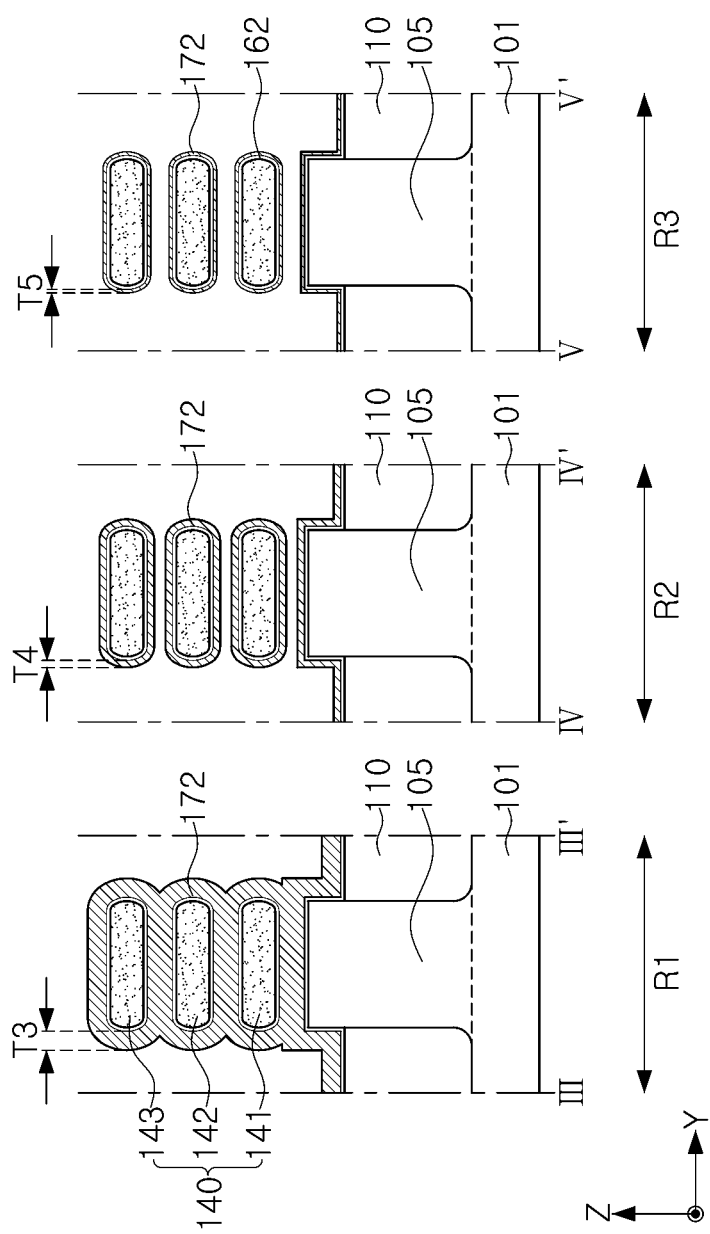

Referring to FIG. 11G, the second mask layer ML2 and the second protective layer PL2 are removed from the first and second regions R1 and R2, and the preliminary first electrode layer 172P may be additionally formed in the first to third regions R1, R2 and R3, thereby forming the first electrode layer 172.

First, the second mask layer ML2 and the second protective layer PL2 are sequentially removed from the first and second regions R1 and R2, thereby exposing the preliminary first electrode layer 172P. Next, preliminary first electrode layer 172P may be additionally formed in the entire first to third regions R1, R2, and R3. In this operation, the preliminary first electrode layer 172P may be further formed with a fifth thickness T5. Accordingly, the preliminary first electrode layer 172P are stacked three times in the first region R1 to have a third thickness T3 that is three times the fifth thickness T5, and in the second region R2, the preliminary first electrode layer 172P are stacked twice to have a fourth thickness T4 that is twice the fifth thickness T5, and in the third region R3, the preliminary first electrode layer 172P may be formed once to have the fifth thickness T5.

Next, the semiconductor device of FIGS. 6A and 6B may be manufactured by further performing the process described above with reference to FIGS. 10G and 10H. According to this manufacturing method, by forming the first electrode layer 172 to have different thicknesses in different areas, the formation of the MBCFET™ devices having various threshold voltages may be facilitated without defects.

As set forth above, by including an air gap having a controlled size in the gate electrode, a semiconductor device having improved electrical characteristics and reliability may be provided.

While example embodiments have been illustrated and described above, it will be apparent to those skilled in the art that modifications and variations could be made without departing from the scope of the present disclosure as defined by the appended claims.

What is claimed is:
1. A semiconductor device comprising:
   a substrate comprising an active region extending in a first direction;

a gate electrode extending in a second direction and intersecting the active region on the substrate, the gate electrode comprising at least one first electrode layer and a second electrode layer;

a plurality of channel layers on the active region and spaced apart from each other in a third direction perpendicular to an upper surface of the substrate, the plurality of channel layers at least partially surrounded by the gate electrode;

a plurality of source/drain regions, with at least one source/drain region on each side of the gate electrode, the plurality of source/drain regions electrically connected to the plurality of channel layers; and one or more air gap regions in the second electrode layer between respective ones of the plurality of channel layers and between a lowermost channel layer of the plurality of channel layers and the active region in the third direction, wherein the at least one first electrode layer or the second electrode layer has a first thickness between adjacent ones of the plurality of channel layers in the third direction, and has a second thickness on side surfaces of the plurality of channel layers, and wherein the second thickness is greater than the first thickness.

2. The semiconductor device of claim 1, wherein a region in which the at least one first electrode layer or the second electrode layer has the first thickness comprises a region overlapping the one or more air gap regions in the third direction.

3. The semiconductor device of claim 1, wherein each of the one or more air gap regions is entirely surrounded by the second electrode layer.

4. The semiconductor device of claim 1, wherein the at least one first electrode layer comprises a plurality of first electrode layers, and the plurality of first electrode layers at least partially surround the plurality of channel layers and are spaced apart from each other in the third direction, wherein the second electrode layer at least partially surrounds each of the plurality of channel layers and is in a connected form as a single layer in the third direction.

5. The semiconductor device of claim 4, wherein the second electrode layer extends along the side surfaces of the plurality of channel layers and has a curve corresponding to the side surfaces.

6. The semiconductor device of claim 1, wherein the gate electrode further comprises a third electrode layer on the second electrode layer and having a flat upper surface.

7. The semiconductor device of claim 1, wherein each of the one or more air gap regions has a length in a range of about 20% to about 50% of a distance between each of adjacent ones of the plurality of channel layers in the third direction.

8. The semiconductor device of claim 1, wherein the second electrode layer comprises a material having a work function different from a work function of the at least one first electrode layer.

9. The semiconductor device of claim 1, wherein the gate electrode comprises a first gate electrode and a second gate electrode spaced apart from each other, and wherein the at least one first electrode layer of the first gate electrode has a first average thickness, and the at least one first electrode layer of the second gate electrode has a second average thickness greater than the first average thickness.

10. A semiconductor device comprising:
a substrate comprising an active region;
a gate electrode extending on the substrate and intersecting the active region, the gate electrode comprising a first electrode layer;
a plurality of channel layers on the active region and spaced apart from each other in a vertical direction perpendicular to an upper surface of the substrate, the plurality of channel layers at least partially surrounded by the gate electrode;
a plurality of source/drain regions, with at least one source/drain region on each side of the gate electrode, the plurality of source/drain regions electrically connected to the plurality of channel layers; and
one or more air gap regions in the gate electrode between the plurality of channel layers in the vertical direction,
wherein the first electrode layer surrounds an entirety of each of the one or more air gap regions and has a reduced thickness in a region overlapping the one or more air gap regions in the vertical direction.

11. The semiconductor device of claim 10, wherein the first electrode layer has a first thickness between adjacent ones of the plurality of channel layers in the vertical direction, and has a second thickness greater than the first thickness on side surfaces of the plurality of channel layers.

12. The semiconductor device of claim 10, wherein the gate electrode further comprises a second electrode layer, and the first and second electrode layers comprise at least one different material from each other, and are both between adjacent ones of the plurality of channel layers in the vertical direction.

13. The semiconductor device of claim 10, wherein the gate electrode further comprises a second electrode layer between the plurality of channel layers and the first electrode layer, and the second electrode layer has a substantially constant thickness on a circumference of the plurality of channel layers.

14. The semiconductor device of claim 10, wherein the gate electrode further comprises a second electrode layer outside the first electrode layer, and the second electrode layer has a substantially constant thickness on a circumference of the plurality of channel layers.

15. The semiconductor device of claim 10, wherein the gate electrode further comprises a second electrode layer, wherein the first electrode layer has a non-uniform thickness and the second electrode layer has a uniform thickness, the first electrode layer has a first thickness between the plurality of channel layers and on an upper surface of the active region and in a region overlapping the one or more air gap regions in the vertical direction, and has a second thickness greater than the first thickness on side surfaces of the plurality of channel layers, and wherein the one or more air gap regions has a thinner shape on an end of the one or more air gap regions than on central portions of the one or more air gap regions in a direction perpendicular to the vertical direction.

* * * * *